US012658256B2

(12) United States Patent
Lin et al.

(10) Patent No.: US 12,658,256 B2
(45) Date of Patent: Jun. 16, 2026

(54) MEMORY DEVICE FOR IN-MEMORY COMPUTING

(71) Applicant: MACRONIX INTERNATIONAL CO., LTD., Hsinchu (TW)

(72) Inventors: Yu-Yu Lin, New Taipei City (TW); Feng-Min Lee, Hsinchu City (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 135 days.

(21) Appl. No.: 18/903,041

(22) Filed: Oct. 1, 2024

(65) Prior Publication Data

US 2025/0022508 A1     Jan. 16, 2025

Related U.S. Application Data

(62) Division of application No. 17/812,783, filed on Jul. 15, 2022, now Pat. No. 12,142,316.

(51) Int. Cl.
*G11C 13/00*      (2006.01)
*G06F 7/544*      (2006.01)

(52) U.S. Cl.
CPC .......... *G11C 13/004* (2013.01); *G06F 7/5443* (2013.01)

(58) Field of Classification Search
CPC .............................. G11C 13/004; G11C 13/00
USPC ......................................................... 365/148
See application file for complete search history.

(56) References Cited

U.S. PATENT DOCUMENTS 11,132,176 B2    9/2021  Hung et al.
11,195,090 B1    12/2021 Chang 11,521,683 B2    12/2022 Tran et al.
2019/0042199 A1*   2/2019  Sumbul ............... G11C 11/4094
2022/0027723 A1*   1/2022  Kolter ...................... G06N 3/08
2022/0129153 A1    4/2022  Chang (Continued)

FOREIGN PATENT DOCUMENTS

TW       202036394 A    10/2020
TW       202226248 A    7/2022

OTHER PUBLICATIONS

Lin, Y.Y., et al.; "A Novel Voltage-Accumulation Vector-Matrix Multiplication Architecture Using Resistor-shunted Floating Gate Flash Memory Device for Low-power and High-density Neural Network Applications;" IEEE; 2018; pp. 2.4.1-2.4.4.

*Primary Examiner* — Muna A Techane
(74) *Attorney, Agent, or Firm* — McClure, Qualey & Rodack, LLP

(57)      ABSTRACT

A memory device includes several computing memory cells each storing a weight value and comprising a first and a second switch elements and a first and a second resistors. The first switch element receives a sensing current and a first input signal related to the input value. The first resistor selectively receives the sensing current through the first switch element in response to the first input signal. The second switch element receives the sensing current and a second input signal related to the input value. The second resistor selectively receives the sensing current through the second switch element in response to the second input signal. When the sensing current flows through the first resistor or the second resistor, the computing memory cell generates a first voltage difference or a second voltage difference corresponding to an output value equal to product of an input value and a weight value.

10 Claims, 10 Drawing Sheets

(56)         References Cited

U.S. PATENT DOCUMENTS

2022/0215239 A1*   7/2022   Tran ....................... G11C 16/10
2022/0309328 A1*   9/2022   Saxena .............. G11C 16/0466

* cited by examiner

MEMORY DEVICE FOR IN-MEMORY COMPUTING

This application is a divisional application of U.S. application Ser. No. 17/812,783 filed at Jul. 15, 2022.

TECHNICAL FIELD

The present disclosure relates to a semiconductor device, and more particularly, relates to a memory device for in-memory computing (IMC).

BACKGROUND

With the evolution of semiconductor technology, memory devices are often used to perform in-memory computing (IMC). Moreover, with the evolution of artificial intelligence (AI) technology, in-memory computing performed by the memory device often include a product operation and a sum operation, where the product operation and the sum operation are combined to perform sum-of-product operation.

Traditionally, memory devices for performing product operations and sum operations often use a circuit structure of "current summation", which uses voltage as the input of the computing memory cell and uses current as the output of the computing memory cell, and uses sum of currents to represent a total output value. However, the circuit structure of "current summation" must process the current output of each computing memory cell and then sum up the currents, resulting in the circuit structure of "current summation" to have higher circuit complexity and higher power consumption.

Therefore, the circuit structure of the memory device needs to be improved, and a circuit structure of "voltage summation" or "resistance value summation" is employed, where the voltage is used as the output of the computing memory cell. It is expected to reduce circuit complexity and power consumption, and capable of supporting different types of sum-of-product operations and logic operations.

SUMMARY

According to one embodiment of the disclosure, a memory device is provided. The memory device includes a plurality of computing memory cells. Each of the computing memory cells stores a weight value, receives an input value and generates an output value. Each of the computing memory cells includes a first switch element, a first resistor, second switch element and a second resistor. The first switch element is for receiving a sensing current and a first input signal, the first input signal is related to the input value. The first resistor is connected to the first switch element in series, the first resistor selectively receives the sensing current through the first switch element in response to the first input signal. The second switch element is for receiving the sensing current and a second input signal, the second input signal is related to the input value. The second resistor is connected to the second switch element in series, the second resistor selectively receives the sensing current through the second switch element in response to the second input signal. When the sensing current flows through the first resistor, the computing memory cell generates a first voltage difference or a second voltage difference, when the sensing current flows through the second resistor, the computing memory cell generates the first voltage difference or the second voltage difference, the first voltage difference and the second voltage difference correspond to the output value, the output value is equal to a product of the input value and the weight value, or the output value is equal to a result of a logical operation of the input value and the weight value.

According to another embodiment of the disclosure, a memory device is provided. The memory device includes a plurality of computing memory cells. Each of the computing memory cells stores a weight value, receives a first input value and a second input value and generates an output value. Each of the computing memory cells includes the following elements. A first set of switch elements, being turned-on or turned-off in response to a first input signal and a second input signal. A first resistor, connected to the first set of switch elements in series, the first resistor selectively receives a sensing current through the first set of switch elements. A second set of switch elements, being turned-on or turned-off in response to a third input signal and a fourth input signal. A second resistor, connected to the second set of switch elements in series, the second resistor selectively receives the sensing current through the second set of switch elements. A third set of switch elements, being turned-on or turned-off in response to the first input signal and the fourth input signal. A third resistor, connected to the third set of switch elements in series, the third resistor selectively receives the sensing current through the third set of switch elements. A fourth set of switch elements, being turned-on or turned-off in response to the third input signal and the second input signal. A fourth resistor, connected to the fourth set of switch elements in series, the fourth resistor selectively receives the sensing current through the fourth set of switch elements. Wherein, the first input signal and the third input signal are related to the first input value, the second input signal and the fourth input signal are related to the second input value, when the sensing current flows through the first resistor, the second resistor, the third resistor or the fourth resistor, the computing memory cell generates at least a first voltage difference or a second voltage difference, the first voltage difference and the second voltage difference correspond to the output value, the output value is equal to a result of a logical operation of the first input value and the second input value.

According to still another embodiment of the disclosure, a memory device is provided. The memory device includes a plurality of computing memory cells. Each of the computing memory cells stores a weight value, receives an input value and generates an output value. Each of the computing memory cells includes a multiplexer and a plurality of resistors. The multiplexer is for receiving a sensing current and a plurality of input signals, the input signals are related to the input value. The resistors are connected to the multiplexer, the resistors selectively receive the sensing current through the multiplexer in response to the input signals. When the sensing current flows through one of the resistors, the computing memory cell generates at least a first voltage difference or a second voltage difference, the first voltage difference and the second voltage difference correspond to the output value, and the output value is equal to a product of the input value and the weight value.

Figure 1A:
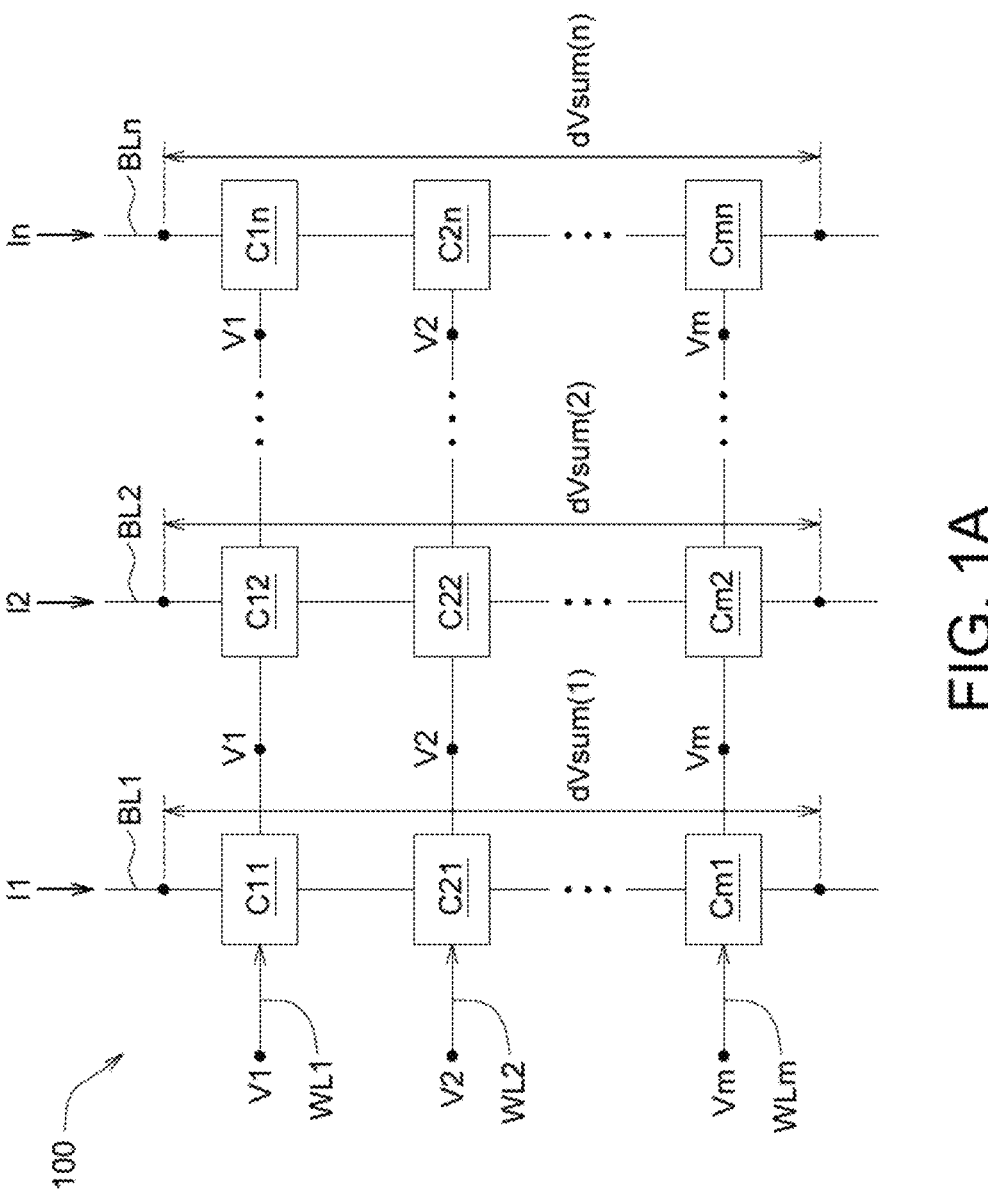
FIG. 1A is a schematic diagram of a memory device of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1A is a schematic diagram of a memory device 100 of the present disclosure. As shown in FIG. 1A, the memory device 100 includes a plurality of computing memory cells C11-Cmn, the computing memory cells C11-Cmn are disposed and arranged in n's vertical columns and m's horizontal rows to perform in-memory computing (IMC).

Computing memory cells C11, C21, . . . , Cm1 of the first vertical column are connected to the bit line BL1 to receive the sensing current I1. Computing memory cells C12, C22, . . . , Cm2 of the second vertical column are connected to the bit line BL2 to receive the sensing current I2. Similarly, computing memory cells C1$n$, C2$n$, . . . , Cmn of the n-th vertical column are connected to the bit line BLn to receive the sensing current In. Computing memory cells of each vertical column may form a NAND-type memory string.

Computing memory cells C11, C12, . . . , C1$n$ of the first horizontal row are connected to the word line WL1 to receive the input voltage V1. Computing memory cells C21, C22, . . . , C2$n$ of the second horizontal row are connected to the word line WL2 to receive the input voltage V2. Similarly, computing memory cells Cm1, Cm2, . . . , Cmn of the m-th horizontal row are connected to the word line WLm to receive the input voltage Vm.

In operation, the sensing current I1 flows through the computing memory cells C11, C21, . . . , Cm1 of the first vertical column, to cause each of the computing memory cells C11, C21, . . . , Cm1 to correspondingly generate a voltage difference, and these voltage differences may be summed up to obtain a total voltage difference dVsum(1), which represents a sum of respective operation results of the computing memory cells C11, C21, . . . , Cm1. For example, the total voltage difference dVsum(1) represents a sum-of-product of the sensing current In and equivalent impedance of the computing memory cells C11, C21, . . . , Cm1. Similarly, the sensing current I2 flows through the computing memory cells C12, C22, . . . , Cm2 of the second vertical column through the bit line BL2 to generate a total voltage difference dVsum(2) which represent a sum-of-product of the sensing current In and equivalent impedance of computing memory cells C12, C22, . . . , Cm2. The sensing current In flows through the computing memory cells C1$n$, C2$n$, . . . , Cmn to generate a total voltage difference dVsum(n), which represents a sum-of-product of the sensing current In and equivalent impedances of computing memory cells C1$n$, C2$n$, . . . , Cmn.

Figure 1B:
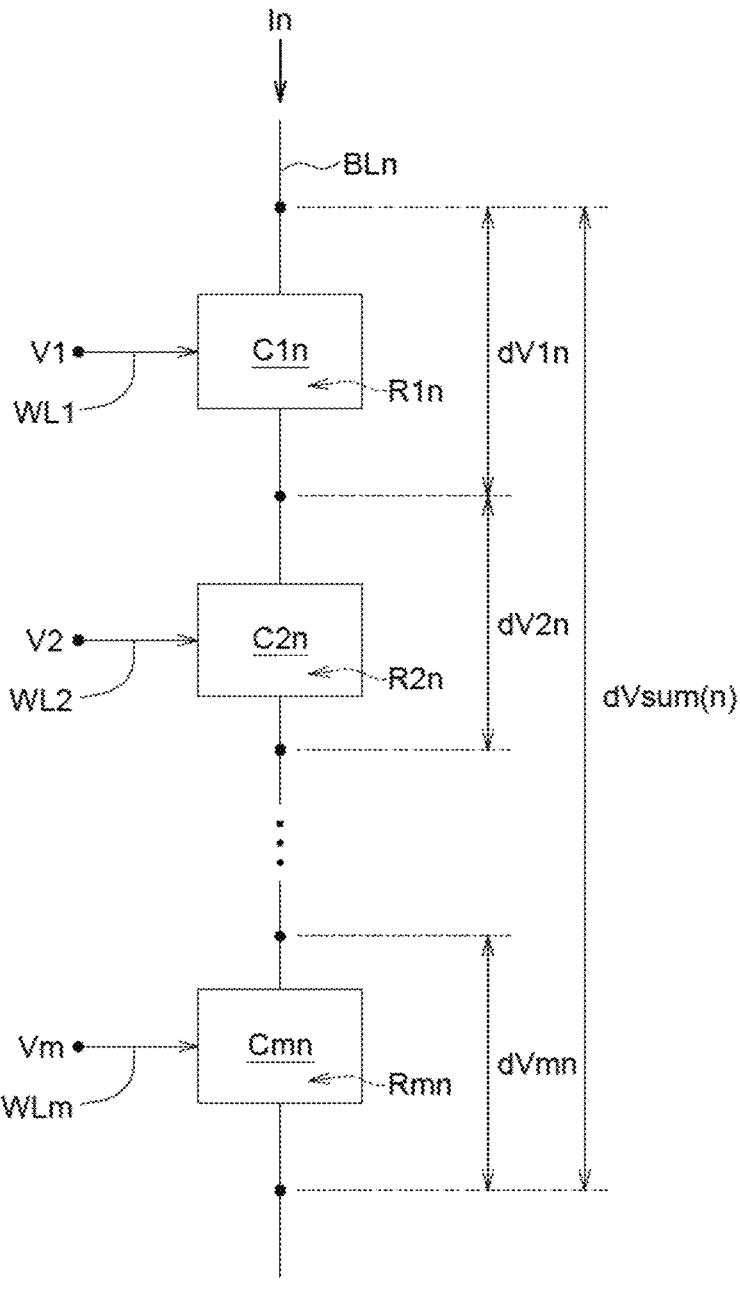
FIG. 1B is a schematic diagram illustrating the sum-of-product operation performed by the memory cells of the n-th vertical column of the memory device.

FIG. 1B is a schematic diagram illustrating the sum-of-product operation performed by the computing memory cells C1$n$, C2$n$, . . . , Cmn of the n-th vertical column of the memory device 100. As shown in FIG. 1B, the computing memory cells C1$n$, C2$n$, . . . , Cmn have equivalent impedances R1$n$, R2$n$, . . . , Rmn respectively. The computing memory cell C1$n$ receives the sensing current In from the bit line BLn, and the computing memory cell C1$n$ generates a voltage difference dV1$n$ which is equal to a product of the sensing current In and the equivalent impedance R1$n$ of the computing memory cell C1$n$. In one example, the computing memory cell C1$n$ may store the weight value W1$n$, and the resistance value of the equivalent impedance R1$n$ may be adjusted according to the weight value Win, and operation state of the computing memory cell C1$n$ may be adjusted according to the input voltage V1. Accordingly, when the voltage difference dV1$n$ corresponds to the output value Y1$n$, and the input voltage V1 corresponds to the input value X1, the output value Y1$n$ is equal to a result of an operation (such as a product operation or a logical operation) of the input value X1 and the weight value W1$n$.

Furthermore, the weight value W2$n$ stored in the computing memory cell C2$n$ may adjust the resistance value of the equivalent impedance R2$n$ of the computing memory cell C2$n$, and the input voltage V2 (corresponding to the input value X2) received by the computing memory cell C2$n$ may adjust the operation state of the computing memory cell C2$n$. The output value Y2$n$ of the computing memory cell C2$n$ (corresponding to the voltage difference dV2$n$) is equal to a result of a product operation or a logical operation of the input value X2 and the weight value W2$n$.

Similarly, the output value Ymn (corresponding to the voltage difference dVmn) of the computing memory cell Cmn is equal to a result of a product operation or a logical operation of the input value Xm (corresponding to the input voltage Vm) and the weight value Wmn.

A sum of the voltage differences dV1$n$, dV2$n$, . . . , dVmn of the computing memory cells C1$n$, C2$n$, . . . , Cmn is the total voltage difference dVsum(n). The total voltage difference dVsum(n) is a sum of product or a sum of logic operation result of the input values X1, X2, . . . , Xm and the weight values W1$n$, W2$n$, . . . , Wmn of the computing memory cells C1$n$, C2$n$, . . . , Cmn.

Figure 2A:
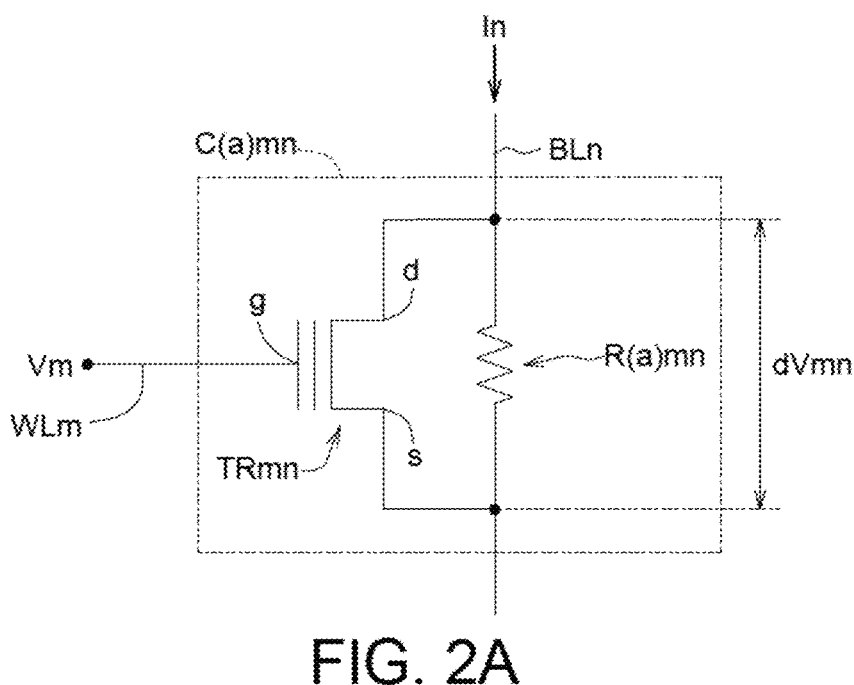
FIG. 2A is a circuit diagram of a computing memory cell of a first embodiment of the present disclosure.

FIG. 2A is a circuit diagram of a computing memory cell C(a)mn of a first embodiment of the present disclosure. The computing memory cell C(a)mn is used to realize the computing memory cells C11-Cmn of the memory device 100 in FIGS. 1A and 1B. The computing memory cell C(a)mn includes a transistor TRmn and a resistor R(a)mn, the transistor TRmn is connected to the resistor R(a)mn in parallel, and the resistor R(a)mn has a fixed resistance value. The computing memory cell C(a)mn is connected to the n-th bit line BLn and the m-th word line WLm. The drain d and the source s of the transistor TRmn are connected to the bit line BLn, and the gate g of the transistor TRmn is connected to the word line WLm. Resistor R(a)mn is also connected to bit line BLn.

The transistor TRmn is, for example, a floating gate transistor. The transistor TRmn has a threshold voltage Vt, and a programming voltage may be applied to adjust the voltage value of the threshold voltage Vt. When the transistor TRmn is in an erase state, the voltage value of the threshold voltage Vt is the first threshold voltage value VtL. When the transistor TRmn is in a programming state, the voltage value of the threshold voltage Vt may be programmed as the second threshold voltage value VtH. The second threshold voltage value VtH is greater than the first threshold voltage value VtL. The first threshold voltage value VtL is, for example, 0.4V, and the second threshold voltage value VtH is, for example, 4.8V. Furthermore, the threshold voltage Vt corresponds to the weight value Wmn stored in the computing memory cell C(a)mn. When the threshold voltage Vt is the first threshold voltage value VtL, it corresponds to the weight value Wmn of "0" stored in the computing memory cell C(a)mn. When the threshold voltage Vt is the second threshold voltage value VtH, the corresponding weight value Wmn stored in the computing memory cell C(a)mn is "1".

The gate g of the transistor TRmn may receive an input voltage Vm through the word line WLm. The input voltage Vm corresponds to the input value Xm received by the computing memory cell C(a)mn. When the voltage value of the input voltage Vm is the first input voltage value VL, the corresponding input value Xm is "1". When the voltage value of the input voltage Vm is the second input voltage value VH, the corresponding input value Xm is "0". The second input voltage value VH is greater than the first input voltage value VL. The second input voltage value VH is, for example, 3V. The first input voltage value VL is, for example, −1V. Moreover, the second input voltage value VH is greater than the second threshold voltage value VtH and the first threshold voltage value VtL. Furthermore, the first input voltage value VL is less than the second threshold voltage value VtH and greater than the first threshold voltage value VtL.

The computing memory cell C(a)mn may receive the sensing current In through the bit line BLn. The sensing current In may flow through the transistor TRmn and/or the resistor R(a)mn, so that the computing memory cell C(a)mn generates a voltage difference dVmn between the drain d and the source s of the transistor TRmn. The voltage difference dVmn is the output voltage of the computing memory cell C(a)mn, and the voltage difference dVmn corresponds to the output value Yn of the computing memory cell C(a)mn. In operation, in response to the input voltage Vm and the threshold voltage Vt of different voltage values, the computing memory cell C(a)mn may generate the voltage difference dVmn of different voltage values and the corresponding output value Yn. Table 1-1 shows the voltage difference dVmn generated by the computing memory cell C(a)mn and the corresponding output value Yn when different input voltages Vm and threshold voltages Vt are provided.

6

TABLE 1-1

| | Vt = VtL Wmn = 0 | | Vt = VtH Wmn = 1 | |
|---|---|---|---|---|
| | dVmn | Yn | dVmn | Yn |
| Vm = VH Xm = 0 | dVs | 0 | dVs | 0 |
| Vm = VL Xm = 1 | dVs | 0 | dVL | 1 |

Referring to Table 1-1, when the input voltage Vm received by the computing memory cell C(a)mn is the second input voltage value VH, and the threshold voltage Vt of the transistor TRmn is the first threshold voltage value VtL or the second threshold voltage value VtH, since the input voltage Vm is greater than the threshold voltage Vt, the transistor TRmn is in a turned-on (i.e., a conducting state). In this case, the sensing current In may flow through the transistor TRmn and the resistor R(a)mn, and the equivalent impedance of the computing memory cell C(a)mn is the equivalent resistance value Rtr of the transistor TRmn itself in parallel with the resistor R(a)mn. In one example, the resistance value of the resistor R(a)mn is much greater than the equivalent resistance value Rtr of the transistor TRmn, so the equivalent impedance of the computing memory cell C(a)mn is substantially equal to the equivalent resistance value Rtr of the transistor TRmn. Accordingly, the voltage difference dVmn generated by the computing memory cell C(a)mn is the first voltage difference dVs, and the first voltage difference dVs is substantially equal to a product of the current value of the sensing current In and the equivalent resistance value Rtr of the transistor TRmn, as shown in equation (1). Since the equivalent resistance value Rtr of the transistor TRmn is very small, the voltage value of the first voltage difference dVs is very small (i.e., approaching 0V). The output value Yn corresponding to the first voltage difference dVs is "0".

$$dVmn = dVs = \text{In} \times Rtr \qquad (1)$$

On the other hand, when the input voltage Vm received by the computing memory cell C(a)mn is the first input voltage value VL, and the threshold voltage Vt of the transistor TRmn is the first threshold voltage value VtL, since the input voltage Vm is greater than the threshold voltage Vt, the transistor TRmn is in the turned-on state. In this condition, the equivalent impedance of the computing memory cell C(a)mn is substantially equal to the equivalent resistance value Rtr of the transistor TRmn, and the voltage difference dVmn generated by the computing memory cell C(a)mn is the first voltage difference dVs (as in the equation (1)), the corresponding output value Yn is "0".

Furthermore, when the input voltage Vm received by the computing memory cell C(a)mn is the first input voltage value VL and the threshold voltage Vt of the transistor TRmn is the second threshold voltage value VtH, since the input voltage Vm is less than the threshold voltage Vt, therefore, the transistor TRmn is in a turned-off state (i.e., an open-circuit state). In this situation, the sensing current In only flows through the resistor R(a)mn, and the equivalent impedance of the computing memory cell C(a)mn is substantially equal to the resistor R(a)mn. Accordingly, the voltage difference dVmn generated by the computing memory cell C(a)mn is the second voltage difference dVL, and the second voltage difference dVL is substantially equal to a product of the current value of the sensing current In and the resistor R(a)mn, as shown in the equation (2). Since the resistance value of the resistor R(a)mn is much greater than the equivalent resistance value Rtr of the transistor TRmn, the second voltage difference dVL is much greater than the first voltage difference dVs. The output value Yn corresponding to the second voltage difference dVL is "1".

$$dVmn = dVL = \text{In} \times R(a)mn \qquad (2)$$

According to the operation manner of the computing memory cell C(a)mn, Table 1-2 shows a truth table of the output value Yn of the computing memory cell C(a)mn corresponding to the input value Xm and the weight value Wmn.

TABLE 1-2

| Xm | Wmn 0 | Wmn 1 |
|----|----|----|
| 0 | Yn = 0 | Yn = 0 |
| 1 | Yn = 0 | Yn = 1 |

Referring to Table 1-2, when the input value Xm is "0" and the weight value Wmn is "0" or "1", the corresponding output value Yn is "0". When the input value Xm is "1" and the weight value Wmn is "0", the corresponding output value Yn is "0". When the input value Xm is "1" and the weight value Wmn is "1", the corresponding output value Yn is "1". Accordingly, the computing memory cell C(a)mn may perform a product operation of the input value Xm and the weight value Wmn, and the output value Yn of the computing memory cell C(a)mn is equal to the product of the input value Xm and the weight value Wmn, as shown in equation (3):

$$Yn = Xm \times Wmn \qquad (3)$$

In the examples described by equations (1) to (3), the output value Yn is represented according to the voltage difference dVmn generated by the computing memory cell C(a)mn. The voltage difference dVmn is equal to a product of the sensing current In and the equivalent resistance value of the computing memory cell C(a)mn, and the voltage difference dVmn is direct proportional to the equivalent resistance value of the computing memory cell C(a)mn. Hence, in another example of FIG. 2A, the output value Yn is represented according to the equivalent resistance value of the computing memory cell C(a)mn. For example, the output value Yn is represented according to the resistor R(a)mn, and the resistor R(a)mn corresponds to the product of the input value Xm and the weight value Wmn.

Similarly, in the example of FIG. 1B, the total voltage difference dVsum(n) of the computing memory cells C1$n$-Cmn is equal to a sum of the products of input values X1-Xm and weight values W1$n$-Wmn. The total voltage difference dVsum(n) is equal to the total equivalent resistance of the computing memory cells C1$n$-Cmn (i.e., a sum of the equivalent resistance R1$n$-Rmn) and the sensing current In, and the total voltage difference dVsum(n) is directly proportional to the sum of the equivalent resistance R1$n$-Rmn. Hence, in another example of FIG. 1B, the output value may be represented according to the sum of the equivalent resistance R1$n$-Rmn of the computing memory cells C1$n$-Cmn. The sum of the equivalent resistance R1$n$-Rmn corresponds to a sum of the products of input values X1-Xm and the weight values W1$n$-Wmn.

Figure 2B:
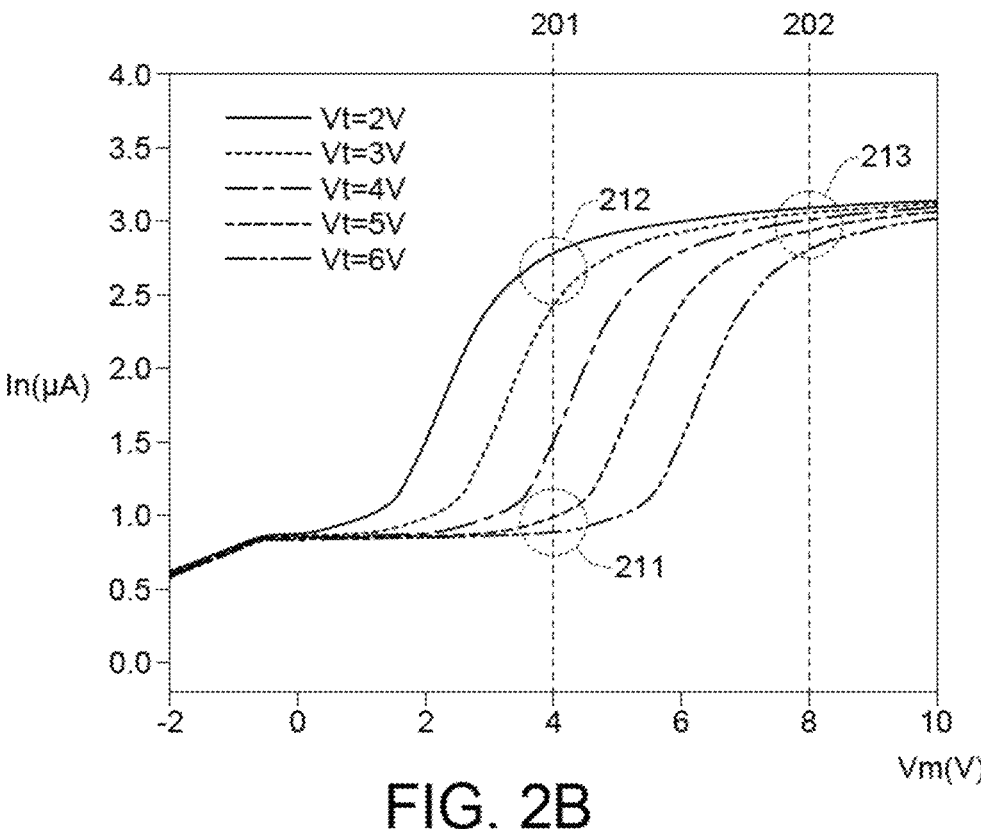
FIG. 2B is a diagram showing the correspondence between the input voltage and the sensing current of the computing memory cell of FIG. 2A.

FIG. 2B is a diagram showing the correspondence between the input voltage Vm and the sensing current In of the computing memory cell C(a)mn of FIG. 2A. As shown in FIG. 2B, a state line 201 indicates that the input voltage Vm is the first input voltage value VL (the first input voltage value VL is a low voltage value, e.g., 4V). On the state line 201, when the threshold voltage Vt of the transistor TRmn is the second threshold voltage value VtH (the second threshold voltage value VtH is a high voltage value, such as 5V or 6V), the computing memory cell C(a)mn is in the state 211. In state 211, the input voltage Vm is less than the threshold voltage Vt, the transistor TRmn is in the turned-off state, hence the sensing current In only flows through the resistor R(a)mn, and the computing memory cell C(a)mn operates in a "resistance state".

On the state line 201, when the threshold voltage Vt of the transistor TRmn is the first threshold voltage value VtL (the first threshold voltage value VtL is a low voltage value, such as 2V or 3V), the computing memory cell C(a)mn is in the state 212. When in the state 212, the input voltage Vm is greater than the threshold voltage Vt, the transistor TRmn is in the turned-on state, the computing memory cell C(a)mn operates in a "transistor state", and the sensing current In may flow through the transistor TRmn and the resistor R(a)mn.

On the other hand, a state line 202 indicates that the input voltage Vm is the second input voltage value VH (the second input voltage value VH is a high voltage value, e.g., 8V). On the state line 202, when the threshold voltage Vt of the transistor TRmn is the first threshold voltage value VtL or the second threshold voltage value VtH, the computing memory cell C(a)mn is in the state 213. When in the state 213, the input voltage Vm is greater than the threshold voltage Vt, the transistor TRmn is in the turned-on state, and the computing memory cell C(a)mn operates in the "transistor state".

Figure 3:
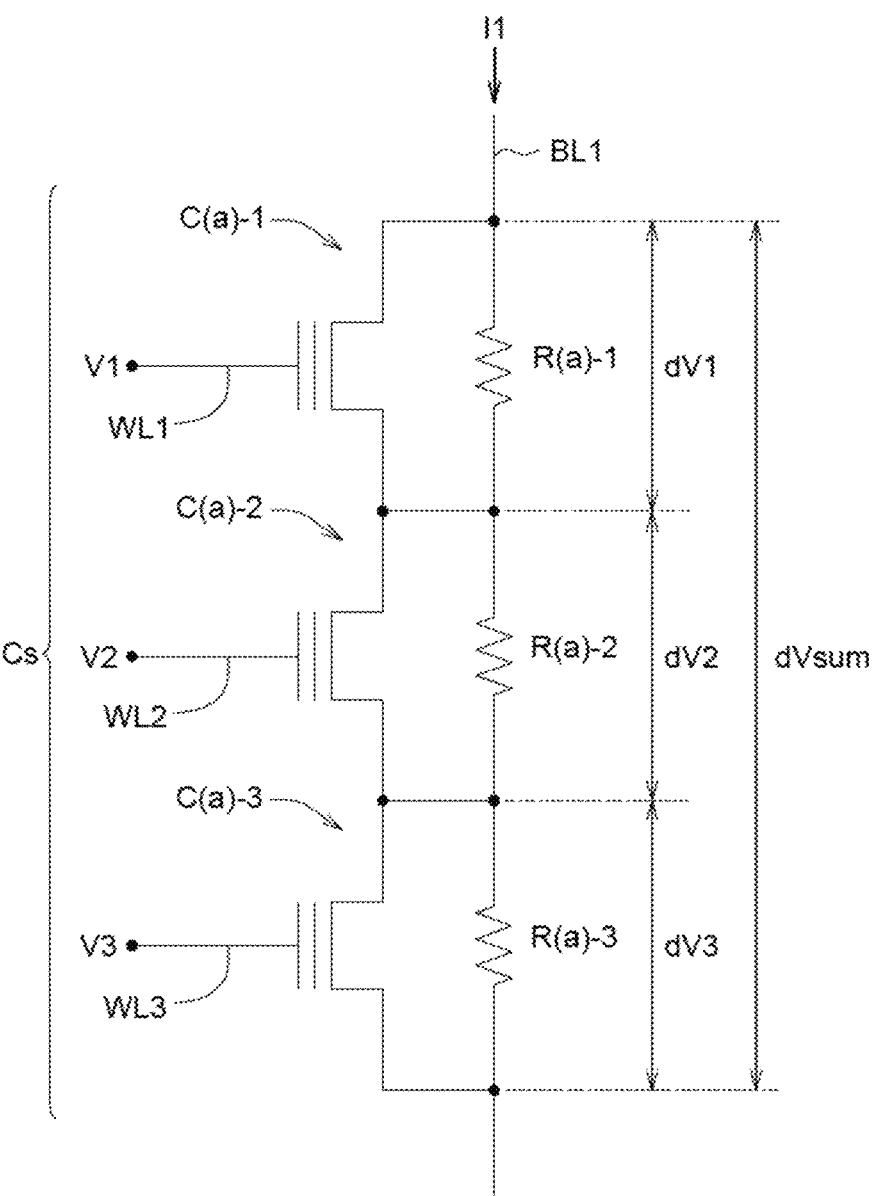
FIG. 3 is a circuit diagram of an computing string composed of the computing memory cell of FIG. 2A.

FIG. 3 is a circuit diagram of an computing string Cs composed of the computing memory cell C(a)mn of FIG. 2A. As shown in FIG. 3, the computing string Cs includes, for example, three computing memory cells C(a)-1, C(a)-2 and C(a)-3 connected in series. Each of computing memory cells C(a)-1, C(a)-2 and C(a)-3 is implemented by the computing memory cell C(a)mn of FIG. 2A.

The computing memory cell C(a)-1 includes a resistor R(a)-1, the computing memory cell C(a)-2 includes a resistor R(a)-2, and the computing memory cell C(a)-3 includes a resistor R(a))-3. The resistors R(a)-1, R(a)-2 and R(a)-3 are also connected in series. Each of the transistors of the computing memory cells C(a)-1, C(a)-2 and C(a)-3 has an equivalent resistance value Rtr. When the transistors of the computing memory cells C(a)-1, C(a)-2 and C(a)-3 are all in the turned-off state, the equivalent impedance of the computing string Cs is a sum of the resistances R(a)-1, R(a)-2 and R(a)-3. When respective transistors of the computing memory cells C(a)-1, C(a)-2 and C(a)-3 are all in the turned-on state, the equivalent impedance of the computing string Cs is a sum of the equivalent resistance values Rtr of respective transistors of the computing memory cells C(a)-1, C(a)-2 and C(a)-3.

The computing string Cs is connected to the bit line BL1 to receive the sensing current I1. The computing memory cells C(a)-1, C(a)-2 and C(a)-3 are respectively connected to the word lines WL1, WL2 and WL3 to receive the input voltages V1, V2 and V3. The input voltages V1, V2 and V3 correspond to the input values X1, X2 and X3, respectively. When the voltage values of the input voltages V1, V2 and V3 are the first input voltage value VL, the corresponding input values X1, X2 and X3 are "1". When the voltage values of the input voltages V1, V2 and V3 are the second input voltage value VH, the corresponding input values X1, X2 and X3 are "0".

The threshold voltages Vt of the transistors of the computing memory cells C(a)-1, C(a)-2 and C(a)-3 correspond to the weight values W1, W2 and W3. When the threshold voltage Vt is the second threshold voltage value VtH, the corresponding weight values W1, W2 and W3 are "1". When the threshold voltage Vt is the first threshold voltage value VtL, the corresponding weight values W1, W2 and W3 are "0". In response to different weight values W1, W2 and W3, when the sensing current I1 flows through the computing memory cells C(a)-1, C(a)-2 and C(a)-3, the computing memory cell C(a)-1, C(a)-2 and C(a)-3 generate voltage differences dV1, dV2 and dV3 respectively. The total voltage difference dVsum generated by the computing string Cs is a sum of the voltage differences dV1, dV2 and dV3.

Table 2-1 shows the total voltage difference dVsum generated by the computing string Cs when different input values X1, X2 and X3 and weight values W1, W2 and W3 are provided. The input values X1, X2 and X3 may form an input vector [X1 X2 X3], and the weight values W1, W2 and W3 may form a weight vector [W1 W2 W3].

voltage value VL of the low voltage value. In this situation, when the threshold voltage Vt of the transistor of the computing memory cell C(a)-3 is the second threshold voltage value VtH (that is, the weight value W3 is "1"), the transistor is in a turned-off state, the sensing current In only flows through the resistor R(a)-3, hence the voltage difference dV3 is the second voltage difference dVL (where dVL=In*(R(a)-3)). In addition, the transistors of the computing memory cells C(a)-1 and C(a)-2 are turned on, and the equivalent impedances of the computing memory cells C(a)-1 and C(a)-2 are the equivalent resistance value Rtr of the transistors. Therefore, the voltage differences dV1 and dV2 are both the first voltage difference dVs, and the first voltage difference dVs is much less than the second voltage difference dVL. The total voltage difference dVsum generated by the computing string Cs is shown in equation (5):

$$dVsum = dVs + dVs + dVL \cong dVL \qquad (5)$$

Furthermore, when the input vector [X1 X2 X3] is [0 1 1], it indicates that both the input voltages V2 and V3 are the first input voltage value VL of a low voltage value. When the transistors of the computing memory cells C(a)-2 and C(a)-3 are at the second threshold voltage value VtH (that is, the weight values W2 and W3 are both "1"), transistor of the computing memory cell C(a)-2 and C(a)-3 are in the turned-off state, the transistor of the computing memory cell C(a)-1 is in the turned-on state, the voltage differences dV2 and

TABLE 2-1

| [X1X2X3] | [W1W2W3] | | | | | | | |
|---|---|---|---|---|---|---|---|---|
| | [000] | [001] | [010] | [011] | [100] | [101] | [110] | [111] |
| [000] | 3dVs | 3dVs | 3dVs | 3dVs | 3dVs | 3dVs | 3dVs | 3dVs |
| [001] | 3dVs | dVL | 3dVs | dVL | 3dVs | dVL | 3dVs | dVL |
| [010] | 3dVs | 3dVs | dVL | dVL | 3dVs | 3dVs | dVL | dVL |
| [011] | 3dVs | dVL | dVL | 2 dVL | 3dVs | dVL | dVL | 2 dVL |
| [100] | 3dVs | 3 dVs | 3dVs | 3dVs | dVL | dVL | dVL | dVL |
| [101] | 3dVs | dVL | 3dVs | dVL | dVL | 2 dVL | dVL | 2dVL |
| [110] | 3dVs | 3dVs | dVL | dVL | dVL | dVL | 2dVL | 2dVL |
| [111] | 3dVs | dVL | dVL | 2dVL | dVL | 2dVL | 2dVL | 3dVL |

Referring to Table 2-1, when the input vector [X1 X2 X3] is [0 0 0], it indicates that the input voltages V1, V2 and V3 are all the second input voltage value VH of high voltage value. In this case, regardless of the value of the weight vector [W1 W2 W3] (that is, regardless of the threshold voltage Vt of the transistors of the computing memory cells C(a)-1, C(a)-2 C(a)-3 is the first threshold voltage value VtL or the second threshold voltage value VtH), the transistors of the computing memory cells C(a)-1, C(a)-2 and C(a)-3 are all turned on, and equivalent impedance of each of the computing memory cells C(a)-1, C(a)-2 and C(a)-3 is the equivalent resistance value Rtr of the transistor. Therefore, the voltage differences dV1, dV2 and dV3 are all the first voltage difference dVs (where dVs=In*Rtr), and the total voltage difference dVsum of the computing string Cs is 3*dVs, as shown in equation (4):

$$dVsum = dVs + dVs + dVs = 3*dVs = 3*In \times Rtr \qquad (4)$$

On the other hand, when the input vector [X1 X2 X3] is [0 0 1], it indicates that the input voltage V3 is the first input dV3 are both the second voltage difference dVL, and the voltage difference dV1 is the first voltage difference dVs. The total voltage difference dVsum generated by the computing string Cs is shown in equation (6):

$$dVsum = dVs + dVL + dVL \cong 2*dVL \qquad (6)$$

When the input vector [X1 X2 X3] is [1 1 1] and the weight vector [W1 W2 W3] is [1 1 1], transistors of the computing memory cells C(a)-1, C(a)-2 and C(a)-3 are all turned off, and the total voltage difference dVsum generated by the computing string Cs is shown in equation (7):

$$dVsum = dVL + dVL + dVL = 3*dVL \qquad (7)$$

The output values corresponding to the voltage differences dV1, dV2, and dV3 generated by the computing memory cells C(a)-1, C(a)-2 and C(a)-3 respectively represent products of the input values X1, X2, and X3 and the weight values W1, W2 and W3, and the total voltage difference dVsum generated by the computing string Cs represents the sum-of-product. Accordingly, the computing string Cs may perform an operation of the sum-of-product, and the output value Y of the computing string Cs is equal to a sum of the products of the input vector [X1 X2 X3] and the weight vector [W1 W2 W3], as shown in equation (8):

$$Y = \sum\nolimits_{m=1}^{3} (Xm \times Wm) \qquad (8)$$

When the total voltage difference dVsum is 3*dVs, the corresponding output value Y is "0". When the total voltage difference dVsum is dVL, 2*dVL or 3*dVL, the corresponding output value Y is "1", "2" or "3". Table 2-2 shows a truth table of the output value Y of the computing string Cs corresponding to the input vector [X1 X2 X3] and the weight vector [W1 W2 W3].

TABLE 2-2

| [X1X2X3] | [000] | [001] | [010] | [011] | [100] | [101] | [110] | [111] |
|---|---|---|---|---|---|---|---|---|
| | | | [W1W2W3] | | | | | |
| [000] | Y = 0 | Y = 0 | Y = 0 | Y = 0 | Y = 0 | Y = 0 | Y = 0 | Y = 0 |
| [001] | Y = 0 | Y = 1 | Y = 0 | Y = 1 | Y = 0 | Y = 1 | Y = 0 | Y = 1 |
| [010] | Y = 0 | Y = 0 | Y = 1 | Y = 1 | Y = 0 | Y = 0 | Y = 1 | Y = 1 |
| [011] | Y = 0 | Y = 1 | Y = 1 | Y = 2 | Y = 0 | Y = 1 | Y = 1 | Y = 2 |
| [100] | Y = 0 | Y = 0 | Y = 0 | Y = 0 | Y = 1 | Y = 1 | Y = 1 | Y = 1 |
| [101] | Y = 0 | Y = 1 | Y = 0 | Y = 1 | Y = 1 | Y = 2 | Y = 1 | Y = 2 |
| [110] | Y = 0 | Y = 0 | Y = 1 | Y = 1 | Y = 1 | Y = 1 | Y = 2 | Y = 2 |
| [111] | Y = 0 | Y = 1 | Y = 1 | Y = 2 | Y = 1 | Y = 2 | Y = 2 | Y = 3 |

The total voltage difference dVsum of the computing string Cs is equal to the product of the sensing current I1 and the total equivalent resistance of the computing string Cs, that is, the total voltage difference dVsum is proportional to the total equivalent resistance of the computing string Cs. Therefore, in another example of FIG. 3, the output value Y of the computing string Cs may be represented according to the total equivalent resistance of the computing string Cs (i.e., a sum of the respective equivalent resistance of the computing memory cells C(a)-1, C(a)-2 and C(a)-3).

When the input vector [X1 X2 X3] is [0 0 0], regardless of the value of the weight vector [W1 W2 W3], the equivalent resistance of each of the computing memory cells C(a)-1, C(a)-2 and C(a)-3 is the equivalent resistance value Rtr of the transistor, and the total equivalent resistance of the computing string Cs is 3*Rtr. Since the equivalent resistance value Rtr of the transistor is very small, the corresponding output value Y is "0".

When the input vector [X1 X2 X3] is [0 0 1] and the weight vector [W1 W2 W3] is [0 0 1], the transistor of the computing memory cell C(a)-3 is in turned-off state, the total equivalent resistance of the computing string Cs is substantially equal to the resistance R(a)-3, and the corresponding output value Y is "1".

When the input vector [X1 X2 X3] is [0 1 1] and the weight vector [W1 W2 W3] is [0 1 1], the transistor of the computing memory cells C(a)-2 and C(a)-3 are in turned-off state, the total equivalent resistance of the computing string Cs is substantially equal to a sum of the resistance R(a)-2 and the resistance R(a)-3, and the corresponding output value Y is "2".

When the input vector [X1 X2 X3] is [1 1 1] and the weight vector [W1 W2 W3] is [1 1 1], the transistor of the computing memory cells C(a)-1, C(a)-2 and C(a)-3 is in turned-off state, the total equivalent resistance of the computing string Cs is substantially equal to a sum of the resistances R(a)-1, R(a)-2 and R(a)-3, and the corresponding output value Y is "3".

In the above example, the total equivalent resistance of the computing string Cs (e.g., the sum of resistance R(a)-1, resistance R(a)-2 and resistance R(a)-3) corresponds to the sum of the products of the input vector [X1 X2 X3] and the weight vector [W1 W2 W3].

Figure 4A:
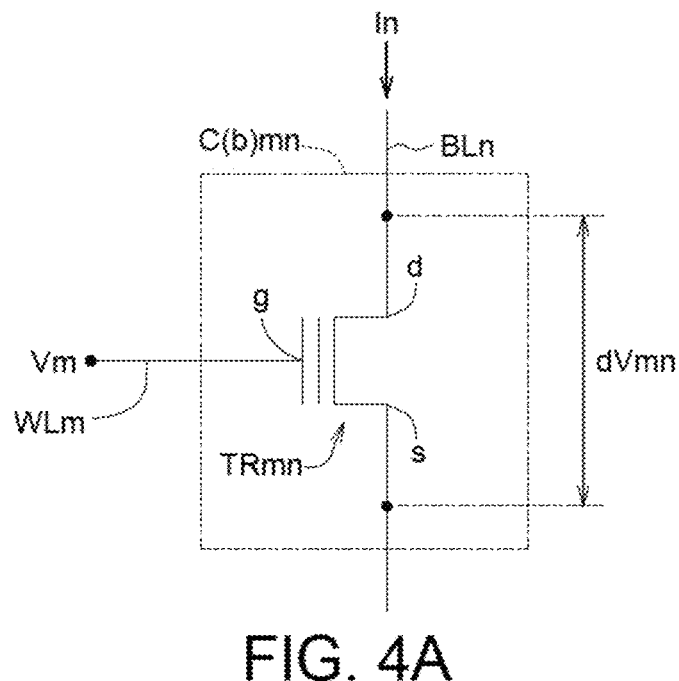
FIG. 4A is a circuit diagram of the computing memory cell of the second embodiment of the present disclosure.

FIG. 4A is a circuit diagram of the computing memory cell C(b)mn of the second embodiment of the present disclosure. Compared with the computing memory cell C(a)mn in FIG. 2A, the computing memory cell C(b)mn in FIG. 4A only includes a transistor TRmn, and does not include a resistor. The sensing current In flows through the transistor TRmn, and a voltage difference dVmn is generated between the drain d and the source s of the transistor TRmn. The voltage difference dVmn corresponds to the output value Yn of the computing memory cell C(b)mn. Table 3-1 shows the voltage difference dVmn generated by the computing memory cell C(b)mn and the corresponding output value Yn when the input voltage Vm and the threshold voltage Vt of different voltage values are provided:

TABLE 3-1

| | Vt = VtL Wmn = 0 | | Vt = VtH Wmn = 1 | |
|---|---|---|---|---|
| | dVmn | Yn | dVmn | Yn |
| Vm = VH Xm = 0 | dVs (LR state) | 0 | dVs (LR state) | 0 |
| Vm = VL Xm = 1 | dVs (LR state) | 0 | dVL (HR state) | 1 |

Referring to Table 3-1, when the input voltage Vm received by the computing memory cell C(b)mn is the second input voltage value VH, and the threshold voltage Vt of the transistor TRmn is the first threshold voltage value VtL or the second threshold voltage value VtH, the transistors TRmn are all turned on, the equivalent impedance of the computing memory cell C(b)mn is substantially equal to the equivalent resistance value Rtr of the transistor TRmn itself, and the computing memory cell C(b)mn operates in a "low resistance state (LR state)")". The voltage difference dVmn generated by the computing memory cell C(b)mn is the first voltage difference dVs, as shown in equation (1). The output value Yn corresponding to the first voltage difference dVs is "0".

On the other hand, when the input voltage Vm received by the computing memory cell C(b)mn is the first input voltage value VL, and the threshold voltage Vt of the transistor TRmn is the first threshold voltage value VtL, the transistor TRmn is turned on, and the operation The cell C(b)mn operates in the low resistance state, and the output value Yn is "0".

Furthermore, when the input voltage Vm received by the computing memory cell C(b)mn is the first input voltage value VL and the threshold voltage Vt of the transistor TRmn is the second threshold voltage value VtH, since the input voltage Vm is less than the threshold voltage Vt, The transistor TRmn is in an off state, and the equivalent impedance of the computing memory cell C(b)mn is a high resistance value and operates in a "high resistance state (HR state)". In the high resistance state, the voltage difference dVmn is the second voltage difference dVL, and the corresponding output value Yn is "1".

Table 3-2 shows a truth table of the output value Yn of the computing memory cell C(b)mn corresponding to the input value Xm and the weight value Wmn, which are the same as the values shown in Table 1-2. Accordingly, the computing memory cell C(b)mn may perform a product operation, and the output value Yn is equal to a product of the input value Xm and the weight value Wmn.

TABLE 3-2

| Xm | Wmn 0 | Wmn 1 |
|---|---|---|
| 0 | Yn = 0 | Yn = 0 |
| 1 | Yn = 0 | Yn = 1 |

Figure 4B:
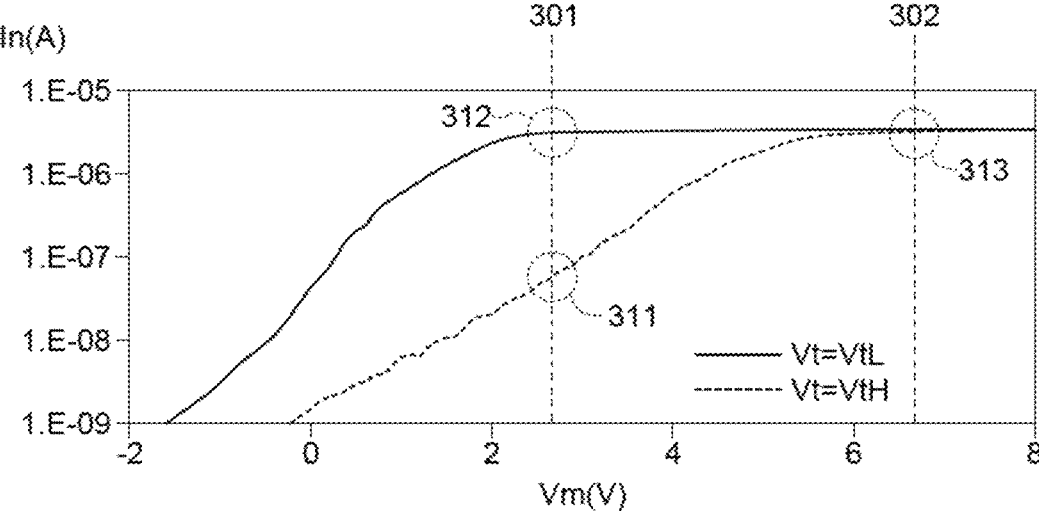
FIG. 4B is a diagram showing the correspondence between the input voltage and the sensing current In of the computing memory cell of FIG. 4A.

FIG. 4B is a diagram showing the correspondence between the input voltage Vm and the sensing current In of the computing memory cell C(b)mn of FIG. 4A. As shown in FIG. 4B, a state line 301 indicates that the input voltage Vm is the first input voltage value VL (the first input voltage value VL is a low voltage value, e.g., 2.8V). On the state line 301, when the threshold voltage Vt of the transistor TRmn is the second threshold voltage value VtH of the high voltage value, the computing memory cell C(b)mn is in the state 311. When in the state 311, the input voltage Vm is less than the threshold voltage Vt, the transistor TRmn is in an off state, and the computing memory cell C(b)mn operates in a high resistance state.

On the state line 301, when the threshold voltage Vt of the transistor TRmn is the first threshold voltage value VtL of the low voltage value, the computing memory cell C(a)mn is in the state 312, where the input voltage Vm is greater than the threshold voltage Vt, the transistor TRmn is turned on, and the computing memory cell C(b)mn operates in a low resistance state.

On the other hand, the state line 302 indicates that the input voltage Vm is the second input voltage value VH. The second input voltage value VH is a high voltage value (such as 6.6V). On the state line 302, when the threshold voltage Vt of the transistor TRmn is the first threshold voltage value VtL or the second threshold voltage value VtH, the computing memory cell C(a)mn is in the state 313. In state 313, the input voltage Vm is greater than the threshold voltage Vt, the transistor TRmn is turned on, and the computing memory cell C(b)mn operates in a low resistance state.

Figure 5:
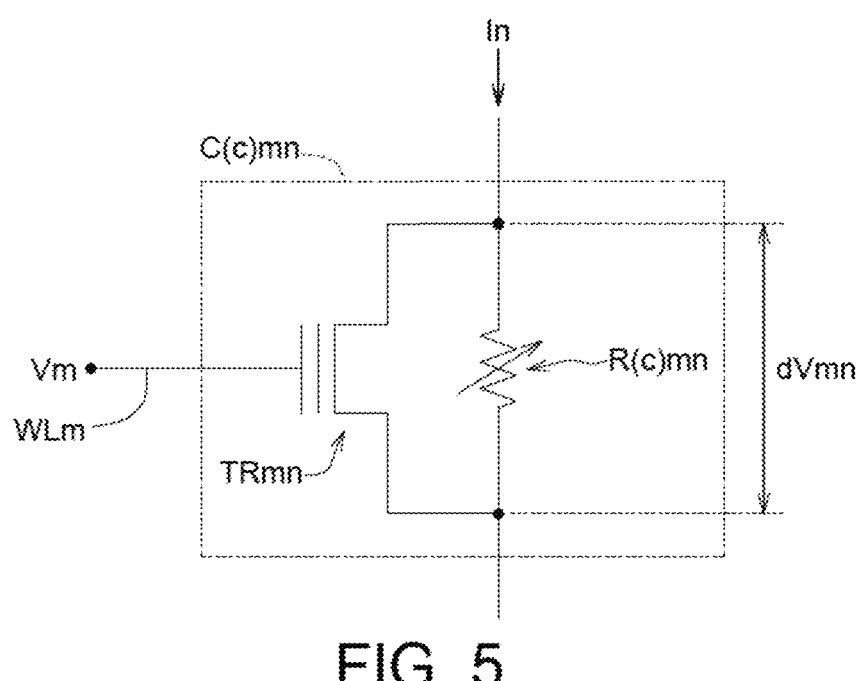
FIG. 5 is a circuit diagram of the computing memory cell according to the third embodiment of the present disclosure.

FIG. 5 is a circuit diagram of the computing memory cell C(c)mn according to the third embodiment of the present disclosure. Compared with the computing memory cell C(a)mn in FIG. 2A, the resistor R(c)mn of the computing memory cell C(c)mn in FIG. 5 is a variable resistor, which has a variable resistance value and may be dynamically adjusted during the operation of the memory device. In another example, resistor R(c)mn has a fixed resistance value, however, process parameters may be adjusted so as to adjust resistance value of resistor R(c)mn during fabrication.

The resistor R(c)mn may be adjusted as, for example, four resistance values R0, R1, R2 and R3, and the ratio of the resistance values R0, R1, R2 and R3 may be adjusted as 0:1:2:3. The resistance value R0 approaches zero, and the resistance value R0 is much smaller than the resistance values R1, R2 and R3. In addition, the equivalent resistance value Rtr of the transistor TRmn of the computing memory cell C(c)mn is also much smaller than the resistance values R1, R2 and R3.

When the weight value Wmn stored in the computing memory cell C(c)mn is "0", the resistor R(c)mn is adjusted as the resistance value R0. Similarly, when the weight value Wmn stored in the computing memory cell C(c)mn is "1", "2" and "3", the resistor R(c)mn is adjusted as the resistance values R1, R2 and R3. Table 4 shows the voltage difference dVmn generated by the computing memory cell C(c)mn and the corresponding output value Yn under the condition of providing different input voltages Vm and weight values Wmn:

TABLE 4

| | Wmn = 0 | | Wmn = 1 | | Wmn = 2 | | Wmn = 3 | |
|---|---|---|---|---|---|---|---|---|
| | dVmn | Yn | dVmn | Yn | dVmn | Yn | dVmn | Yn |
| Vm = VH Xm = 0 | In*Rtr | 0 | In*Rtr | 0 | In*Rtr | 0 | In*Rtr | 0 |
| Vm = VL Xm = 1 | In*R0 | 0 | In*R1 | 1 | In*R2 | 2 | In*R3 | 3 |

Please refer to Table 4, when the input value Xm is "0", the input voltage Vm is the second input voltage value VH of a high voltage value, the transistor TRmn is in the turned-on state, and the equivalent resistance of the computing memory cell C(c)mn is substantially equal to the equivalent resistance value Rtr of the transistor TRmn itself. In this case, regardless of whether the weight value Wmn is set to "0", "1", "2" or "3" (that is, regardless of whether the resistor R(c)mn is adjusted as the resistance value R0, R1, R2 or R3), the voltage difference dVmn generated by the computing memory cell C(c)mn is substantially equal to a product of the sensing current In and the equivalent resistance value Rtr of the transistor TRmn. In this case, the corresponding output values Yn are all "0".

On the other hand, when the input value Xm is "1", the input voltage Vm is the first input voltage value VL of a low voltage value, the transistor TRmn is in the turned-off state, and the equivalent resistance of the computing memory cell C(c)mn is the resistor R(c)mn, and the voltage difference dVmn is substantially equal to a product of the sensing current In and the resistor R(c)mn. When the weight value Wmn is set as "0", "1", "2" and "3", the resistor R(c)mn is adjusted as the resistance values R0, R1, R2 and R3, the voltage difference dVmn is equal to products of the sensing current In and the resistance values R0, R1, R2 and R3 respectively. Since the ratio of the resistance values R0, R1, R2 and R3 is adjusted as 0:1:2:3, the corresponding output value Yn is "0", "1", "2" or "3" respectively. Accordingly, the computing memory cell C(c)mn may perform a product operation, and the output value Yn is equal to a product of the input value Xm and the weight value Wmn.

Figure 6:
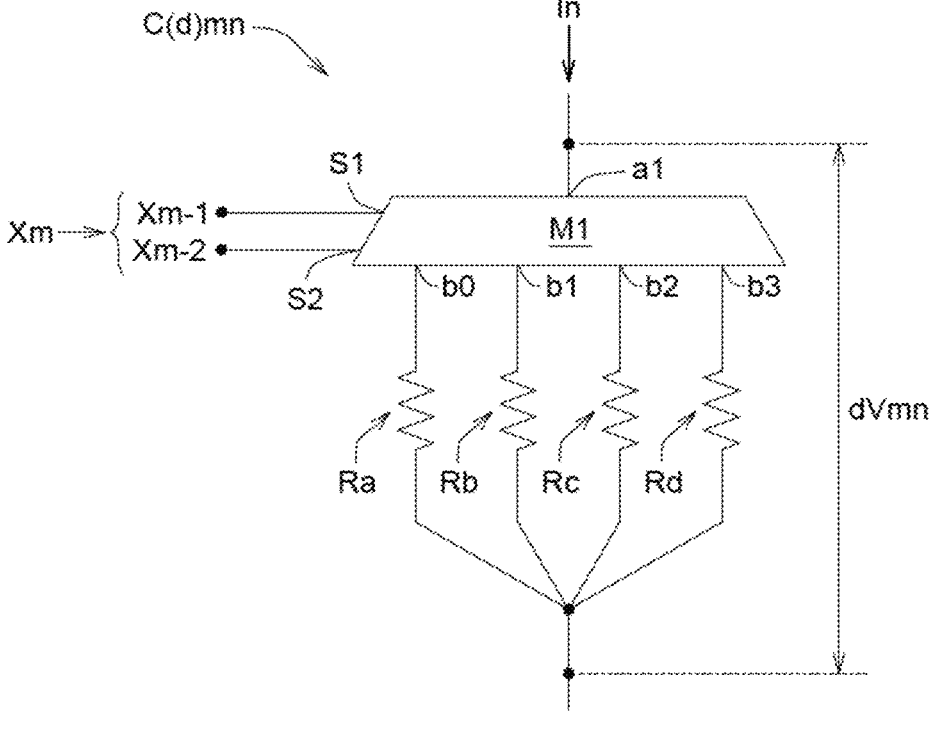
FIG. 6 is a circuit diagram of the computing memory cell according to the fourth embodiment of the present disclosure.

FIG. 6 is a circuit diagram of the computing memory cell C(d)mn according to the fourth embodiment of the present disclosure. As shown in FIG. 6, the computing memory cell C(d)mn includes a multiplexer M1 and resistors Ra, Rb, Rc and Rd. The multiplexer M1 has one input terminal a1, four output terminals b0, b1, b2 and b3, and two control terminals S1 and S2. The input terminal a1 is connected to the bit line to receive the sensing current In. The control terminals S1 and S2 are connected to a set of word lines to receive the input signals Xm-1 and Xm-2. For example, the control terminal S1 receives the input signal Xm-1 through the first word line, and the control terminal S2 receives the input signal Xm-2 through the second word line. According to the input signals Xm-1 and Xm-2, the multiplexer M1 selectively outputs the sensing current In to one of the output terminals b0, b1, b2 and b3. The output terminals b0, b1, b2 and b3 are respectively connected to the resistors Ra, Rb, Rc and Rd.

In operation, the input value Xm of the computing memory cell C(d)mn corresponds to the two-bit input signals Xm-1 and Xm-2. The input value Xm is "0", corresponding to the input signals Xm-1 and Xm-2 of "0 0", so as to control the multiplexer M1 to output the sensing current In to the output terminal b0 and flow through the resistor Ra. In this case, the computing memory cell C(d)mn generates a voltage difference dVmn equal to In*Ra. Similarly, the input value Xm is "1", "2" and "3", corresponding to the input signals Xm-1 and Xm-2 of "0 1", "1 0" and "1 1", the sensing current In is outputted at the output terminals b1, b2 and b3, and flow through the resistors Rb, Rc and Rd. The voltage difference dVmn generated by the computing memory cell C(d)mn is In*Rb, In*Rc and In*Rd.

The computing memory cell C(d)mn may store the weight value Wmn, and correspondingly adjust the resistance values of the resistors Ra, Rb, Rc and Rd according to the weight value Wmn. That is, the weight value Wmn corresponds to different resistance values of the resistors Ra, Rb, Rc and Rd. When the weight value Wmn is "0", the resistors Ra, Rb, Rc and Rd are all adjusted as the resistance value R0, where the resistance value R0 approaches zero. When the weight value Wmn is "1", the resistors Ra, Rb, Rc and Rd are adjusted as the resistance values R0, R1, R2 and R3 respectively. The ratio of the resistance values R0, R1, R2 and R3 is adjusted as 0:1:2:3.

Similarly, when the weight value Wmn is "2", the resistors Ra, Rb, Rc and Rd are adjusted as twice the resistance values R0, R1, R2 and R3 respectively. That is, the resistors Ra, Rb, Rc and Rd are adjusted as 2*R0, 2*R1, 2*R2 and 2*R3, respectively. When the weight value Wmn is "3", the resistors Ra, Rb, Rc and Rd are adjusted as 3*R0, 3*R1, 3*R2 and 3*R3, respectively.

The voltage difference dVmn generated by the computing memory cell C(d)mn corresponds to the output value Yn. When the weight value Wmn is "0", if the input value Xm is "0", "1", "2" and "3", the corresponding voltage difference dVmn is In*R0, In*R0, In*R0 and In*R0. Since the resistance value R0 approaches zero, the output values Yn are "0", "0", "0" and "0", which corresponds to the voltage differences In*R0, In*R0, In*R0 and In*R0. When the weight value Wmn is "1", if the input value Xm is "0", "1", "2" and "3" respectively, the voltage difference dVmn is In*R0, In*R1, In*R2 and In*R3. Since the ratio of the resistance values R0, R1, R2 and R3 is 0:1:2:3, the output values Yn are "0", "1", "2" and "3", which corresponds to the voltage differences In*R0, In*R1, In*R2 and In*R3.

Similarly, when the weight value Wmn is "2", if the input value Xm is "0", "1", "2" and "3" respectively, the voltage difference dVmn is In*2*R0, In*2*R1, In*2*R2 and In*2*R3. The corresponding output values Yn are "0", "2", "4" and "6" respectively. When the weight value Wmn is "3", if the input value Xm is "0", "1", "2" and "3", the voltage difference dVmn is In*3*R0, In*3*R1, In*3*R2 and In*3*R3. The corresponding output values Yn are "0", "3", "6" and "9".

According to the above calculation, Table 5-1 shows the voltage difference dVmn and the corresponding output value Yn generated by the calculation unit C(d)mn under the condition of providing different input values Xm and weight values Wmn:

TABLE 5-1

| | Wmn = 0 | | Wmn = 1 | | Wmn = 2 | | Wmn = 3 | |
|---|---|---|---|---|---|---|---|---|
| | dVmn | Yn | dVmn | Yn | dVmn | Yn | dVmn | Yn |
| Xm = 0 | In*R0 | 0 | In*R0 | 0 | In*2*R0 | 0 | In*3*R0 | 0 |
| Xm = 1 | In*R0 | 0 | In*R1 | 1 | In*2*R1 | 2 | In*3*R1 | 3 |
| Xm = 2 | In*R0 | 0 | In*R2 | 2 | In*2*R2 | 4 | In*3*R2 | 6 |
| Xm = 3 | In*R0 | 0 | In*R3 | 3 | In*2*R3 | 6 | In*3*R3 | 9 |

In addition, Table 5-2 shows a truth table of the output value Yn of the computing memory cell C(d)mn corresponding to the input value Xm and the weight value Wmn. The computing memory cell C(d)mn may perform a product operation, and the output value Yn is equal to the product of the input value Xm and the weight value Wmn.

TABLE 5-2

| | Wmn | | | |
|---|---|---|---|---|
| Xm | 0 | 1 | 2 | 3 |
| 0 | Yn = 0 | Yn = 0 | Yn = 0 | Yn = 0 |
| 1 | Yn = 0 | Yn = 1 | Yn = 2 | Yn = 3 |
| 2 | Yn = 0 | Yn = 2 | Yn = 4 | Yn = 6 |
| 3 | Yn = 0 | Yn = 3 | Yn = 6 | Yn = 9 |

Figure 7:
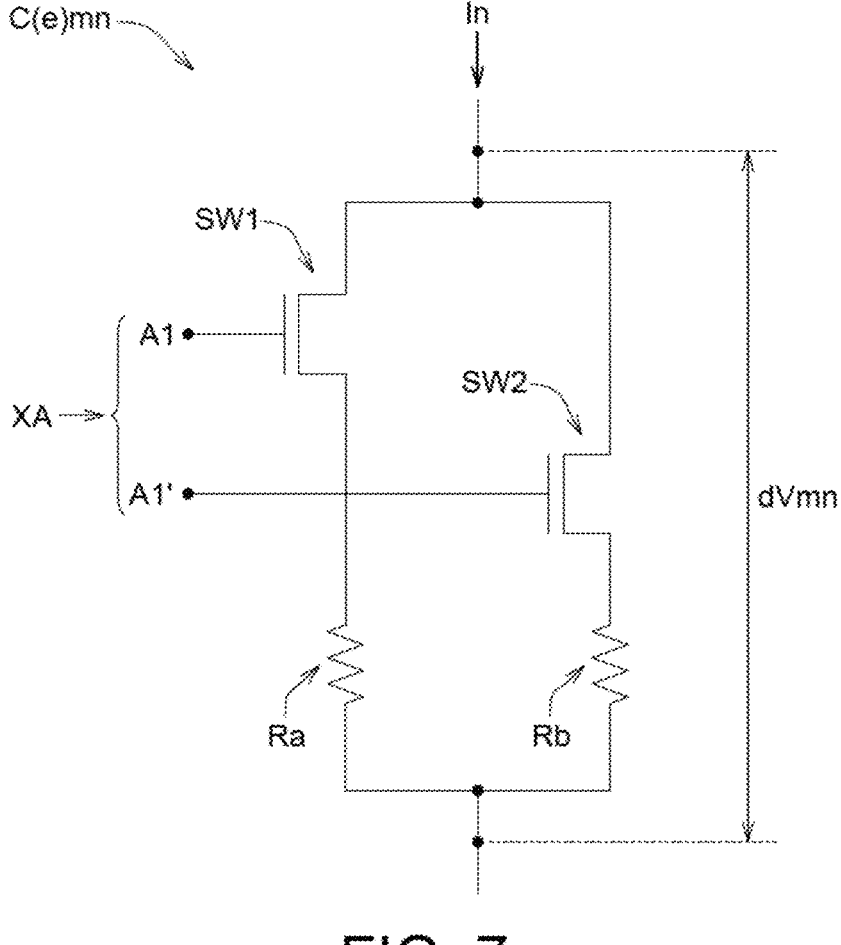
FIG. 7 is a circuit diagram of the computing memory cell according to the fifth embodiment of the present disclosure.

FIG. 7 is a circuit diagram of the computing memory cell C(e)mn according to the fifth embodiment of the present disclosure. As shown in FIG. 7, the computing memory cell C(e)mn includes switch elements SW1 and SW2 and resistors Ra and Rb. In one example, the switch elements SW1 and SW2 are NMOS transistors, which receive the input signals A1 and A1' through the gates of the transistors. The operation of the switch elements SW1 and SW2 in this embodiment is similar to a multiplexer, which is similar to multiplexer M1 in the embodiment of FIG. 6. That is, in this embodiment of FIG. 7, the multiplexer is realized by the switch elements SW1 and SW2.

The input signals A1 and A1 correspond to the input value XA of the computing memory cell C(e)mn. The input value XA of "0" corresponds to the input signals A1 and A1' of "0 1", the switch element SW1 is in a turned-off state and the switch element SW2 is in a turned-on state. In this case, the sensing current In only flows through the resistor Rb through the switch element SW2, and the voltage difference dVmn generated by the computing memory cell C(e)mn is In*Rb. The computing memory cell C(e)mn may store the weight value Wmn, and adjust the resistors Ra and Rb as the first resistance value RL or the second resistance value RH according to the weight value Wmn, respectively. Wherein, the second resistance value RH is greater than the first resistance value RL, and the first resistance value RL approaches zero. If the weight value Wmn is "0", the resistor Rb is adjusted as the first resistance value RL. In this case, the voltage difference dVmn is equal to In*Rb and equal to In*RL (In*RL may be referred to as "the first voltage difference"), and the corresponding output value Yn is "0". If the weight value Wmn is "1", the resistance Rb is still adjusted as the first resistance value RL, the voltage difference dVmn is still In*RL, and the corresponding output value Yn is still "0".

On the other hand, the input value XA of "1" corresponds to the input signals A1 and A1' of "1 0", the switch element SW1 is in the turned-on state and the switch element SW2 is in the turned-off state. The sensing current In only flows through the resistor Ra through the switch element SW1, and the voltage difference dVmn generated by the computing memory cell C(e)mn is In*Ra. In this case, if the weight value Wmn is "0", the resistor Ra is adjusted as the first resistance value RL, the voltage difference dVmn is equal to In*Ra and equal to In*RL, and the corresponding output value Yn is "0". If the weight value Wmn is "1", the resistor Ra is adjusted as the second resistance value RH, the voltage difference dVmn is equal to In*RH (In*RH may be referred to as "the second voltage difference"), and the corresponding output value Yn is "1"".

According to the above calculation, Table 6-1 shows the voltage difference dVmn and the corresponding output value Yn generated by the calculation unit C(e)mn under the condition of providing different input values XA and weight values Wmn.

TABLE 6-1

| Logic AND | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RL | 0 | ln*Rb = ln*RL | 0 |
| XA = 1 | A1 = 1 A1' = 0 | ln*Ra = ln*RL | 0 | ln*Ra = ln*RH | 1 |

Table 6-2 shows a truth table of the input value XA, the weight value Wmn and the output value Yn of the computing memory cell C(e)mn. According to Table 6-2, the computing memory cell C(e)mn may perform a product operation of the input value XA and the weight value Wmn.

In addition, as shown in Table 6-2, the computing memory cell C(e)mn may also perform the logical "AND" operation of the input value XA and the weight value Wmn, and the output value Yn is equal to a result of the logical "AND" operation of the input value XA and the weight value Wmn.

TABLE 6-2

| | | Wmn | |
|---|---|---|---|
| XA | | 0 | 1 |
| 0 | | Yn = 0 | Yn = 0 |
| 1 | | Yn = 0 | Yn = 1 |

The computing memory cell C(e)mn in FIG. 7 may also perform other logical operations when the resistance values of the resistors Ra and Rb are correspondingly adjusted according to the weight value Wmn. Taking the logic "NAND" operation as an example, when the input value XA is "0", the sensing current In flows through the resistor Rb, and the voltage difference dVmn is In*Rb. In this case, regardless of the weight value Wmn being "0" or "1", the resistor Rb is adjusted as the second resistance value RH, and the voltage difference dVmn is equal to In*RH, while the corresponding output value Yn is "1". When the input value XA is "1", the sensing current In flows through the resistor Ra, and the voltage difference dVmn is In*Ra. In this case, when the weight values Wmn are "0" and "1" respectively, the resistor Ra is adjusted as the second resistance value RH and the first resistance value RL respectively, and the voltage difference dVmn is respectively equal to In*RH and In*RL, corresponding to output values Yn of "1" and "0". When the computing memory cell C(e)mn performs the logical "NAND" operation, the relationship between the input value XA, the weight value Wmn, the voltage difference dVmn and the output value Yn is shown in Table 6-3.

TABLE 6-3

| Logic NAND | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RH | 1 | ln*Rb = ln*RH | 1 |
| XA = 1 | A1 = 1 A1' =0 | ln*Ra = ln*RH | 1 | ln*Ra = ln*RL | 0 |

When changing the relationship between the input value XA, the weight value Wmn and the resistors Ra and Rb being adjusted as the first resistance value RL or the second resistance value RH shown in Table 6-1 and Table 6-3, the computing memory cell C(e)mn may perform different logical operations. Table 6-4 to Table 6-7 respectively represent the logical "OR" operation, logical "NOR" operation, logical "XNOR" operation and logical "XOR" operation of the input value XA and the weight value Wmn.

TABLE 6-4

| Logic OR | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RL | 0 | ln*Rb = ln*RH | 1 |
| XA = 1 | A1 = 1 A1' = 0 | ln*Ra = ln*RH | 1 | ln*Ra = ln*RH | 1 |

TABLE 6-5

| Logic NOR | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RH | 1 | ln*Rb = ln*RL | 0 |
| XA = 1 | A1 = 1 A1' = 0 | ln*Ra = ln*RL | 0 | ln*Ra = ln*RL | 0 |

TABLE 6-6

| Logic XNOR | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RH | 1 | ln*Rb = ln*RL | 0 |
| XA = 1 | A1 = 1 A1' = 0 | ln*Ra = ln*RL | 0 | ln*Ra = ln*RH | 1 |

TABLE 6-7

| Logic XOR | | Wmn = 0 | | Wmn = 1 | |
|---|---|---|---|---|---|
| operation | | dVmn | Yn | dVmn | Yn |
| XA = 0 | A1 = 0 A1' = 1 | ln*Rb = ln*RL | 0 | ln*Rb = ln*RH | 1 |
| XA = 1 | A1 = 1 A1' = 0 | ln*Ra = ln*RH | 1 | ln*Ra = ln*RL | 0 |

Figure 8:
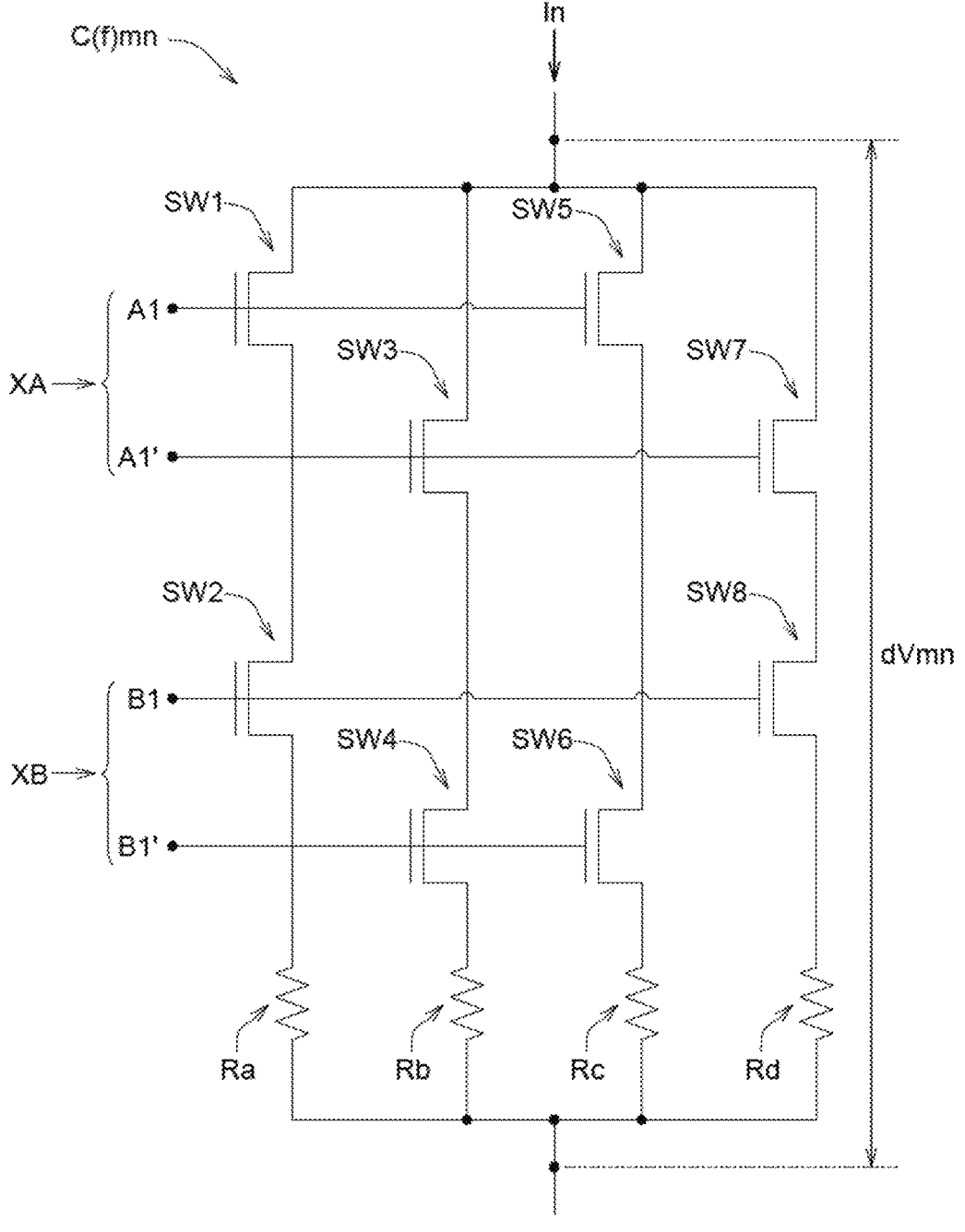
FIG. 8 is a circuit diagram of the computing memory cell according to the sixth embodiment of the present disclosure.

FIG. 8 is a circuit diagram of the computing memory cell C(f)mn according to the sixth embodiment of the present disclosure. Compared with the computing memory cell C(d)mn in FIG. 6 that receives a one-bit input value XA to perform an operation, the computing memory cell C(f)mn in FIG. 8 receives a two-bit input value [XA XB] to perform the operation. As shown in FIG. 8, the computing memory cell C(f)mn includes eight switch elements SW1 to SW8 and four resistors Ra, Rb, Rc and Rd. The first set of switch elements SW1 and SW2 are connected to the resistor Ra in series, the second set of switch elements SW3 and SW4 are connected to the resistor Rb in series, the third set of switch elements SW5 and SW6 are connected to the resistor Rc in series, and the fourth set of switches SW7 and SW8 are connected to the resistor Rd in series.

The switch elements SW1 and SW5 are connected to a word line to receive the input signal A1. The switch elements SW3 and SW7 are connected to an inverted word line to receive the input signal A1'. The switch elements SW2 and SW8 are connected to another word line to receive the input signal B1. The switch elements SW4 and SW6 are connected to another inverted word line to receive the input signal B1'. The input signal A1' is the inversion of the input signal A1, and the input signal B1' is the inversion of the input signal B1. The switch elements SW1, SW3, SW5, and SW7 are jointly connected to the bit line to receive the sensing current In. The switch elements SW1 to SW8 are, for example, NMOS transistors, and receive the input signals A1, A1', B1 and B1' through the gates of the transistors. In this embodiment, switch elements SW1 to SW8 are used to implement the multiplexer, and functions of the switch elements SW1-SW8 are similar to the multiplexer M1 in FIG. 6. The switch elements SW1-SW8 are respectively controlled to be turned on or off, by the input values XA and XB. Hence, the sensing current In selectively flows through one of the resistors Ra-Rd through the switch elements SW1-SW8.

The input value XA corresponds to the input signals A1 and A1', and the input value XB corresponds to the input signals B1 and B1'. The input values XA and XB being "0 0" correspond to the input signals A1, A1', B1 and B1' being "0 1 0 1". In this case, the switch elements SW3, SW7, SW4 and SW6 are turned on, and the switch elements SW1, SW5, SW2 and SW8 are turned off. The sensing current In flows through the resistor Rb through the switch elements SW3 and SW4, and the corresponding voltage difference dVmn generated by the computing memory cell C(f)mn is In*Rb.

The input values XA and XB being "0 1" correspond to the input signals A1, A1', B1 and B1' being "0 1 1 0", in this case the switch elements SW3, SW7, SW2 and SW8 are turned-on and the switch elements SW1, SW5, SW4 and SW6 are turned-off. The sensing current In flows through the resistor Rd through the switch elements SW7 and SW8, and the corresponding voltage difference dVmn generated by the computing memory cell C(f)mn is In*Rd.

The input values XA and XB being "1 0" correspond to the input signals A1, A1', B1 and B1' being "1 0 0 1". In this case, the switch elements SW1, SW5, SW4 and SW6 are turned-on, while SW3, SW7, SW2 and SW8 are turned-off. The sensing current In flows through the resistor Rc through the switch elements SW5 and SW6, and the corresponding voltage difference dVmn generated by the computing memory cell C(f)mn is In*Rc.

The input values XA and XB being "1 1" correspond to the input signals A1, A1', B1 and B1' being "1 0 1 0". In this case, the switch elements SW1, SW5, SW2 and SW8 are turned-on, while SW3, SW7, SW4 and SW6 are turned-off, the sensing current In flows through the resistor Ra through the switch elements SW1 and SW2. The corresponding voltage difference dVmn generated by the computing memory cell C(f)mn is In*Ra.

According to the above calculation, Table 7 shows the voltage difference dVmn generated by the computing memory cell C(f)mn when different input values XA and XB are provided:

TABLE 7

|  |  | dVmn |
|---|---|---|
| XA XB = [0 0] | A1 A1' B1 B1' = [0 1 0 1] | In*Rb |
| XA XB = [0 1] | A1 A1' B1 B1' = [0 1 1 0] | In*Rd |
| XA XB = [1 0] | A1 A1' B1 B1' = [1 0 0 1] | In*Rc |
| XA XB = [1 1] | A1 A1' B1 B1' = [1 0 1 0] | In*Ra |

The computing memory cell C(f)mn may store the weight value Wmn and adjust the resistance values of the resistors Ra, Rb, Rc and Rd according to the weight value Wmn. In one example, similar to the adjustment method of the resistance value of the computing memory cell C(d)mn in FIG. 6, when the weight value Wmn is "0", the resistors Ra, Rb, Rc and Rd are all adjusted as the resistance value R0. When the weight value Wmn is "1", the resistors Ra, Rb, Rc and Rd are adjusted as the resistance values R3, R0, R2 and R1, respectively. When the weight value Wmn is "2", the resistors Ra, Rb, Rc and Rd are adjusted as 2*R3, 2*R0, 2*R2, and 2*R1 respectively. When the weight value Wmn is "3", the resistors Ra, Rb, Rc and Rd are adjusted as 3*R3, 3*R0, 3*R2 and 3*R1 respectively. Accordingly, the computing memory cell C(f)mn of this embodiment may perform a product operation as shown in Table 5-1. In other examples, the resistance values of the resistors Ra, Rb, Rc and Rd may be modulated according to the weight value Wmn, so that the computing memory cell C(f)mn performs different types of logic operations.

Figure 9:
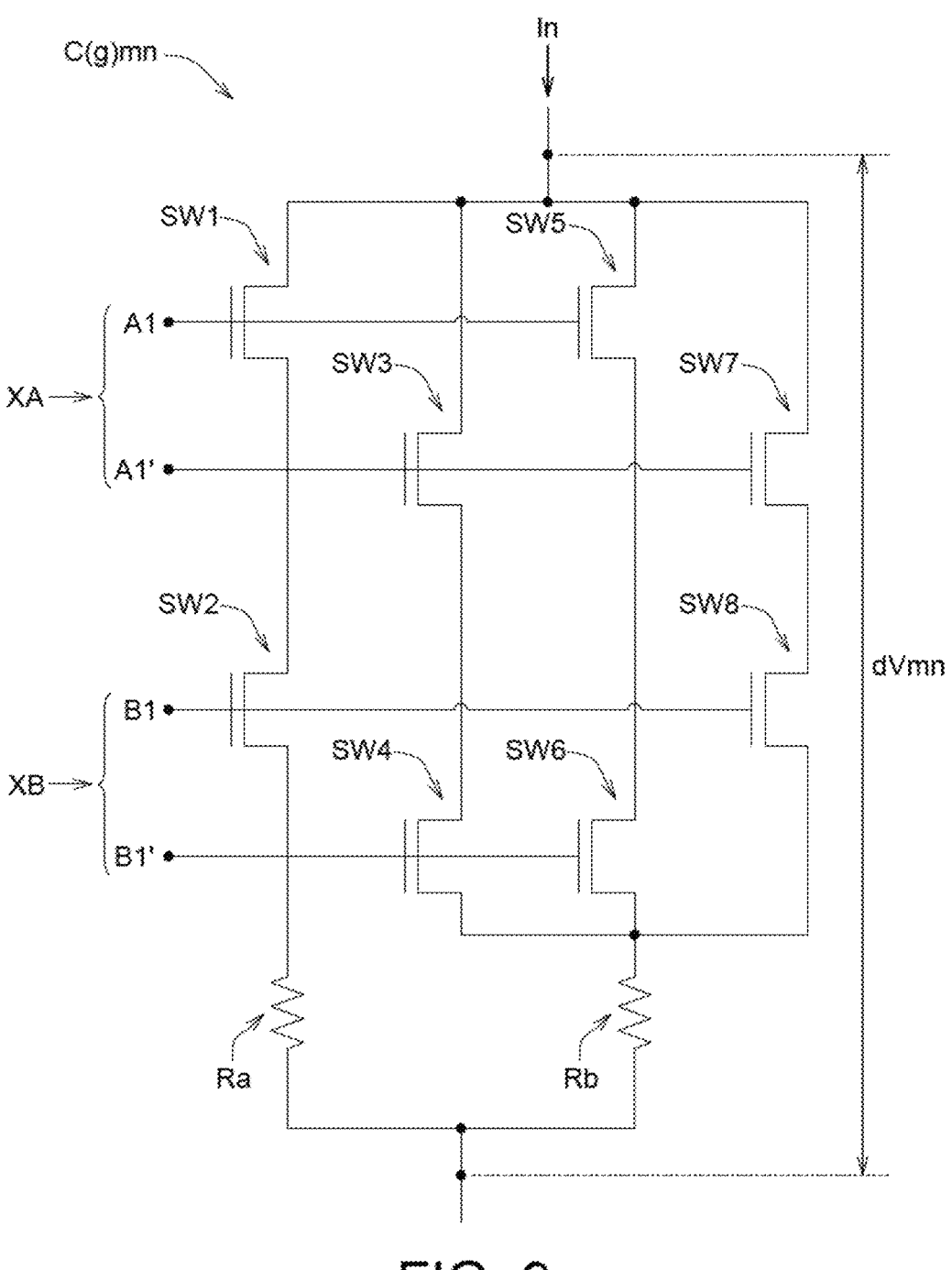
FIG. 9 is a circuit diagram of a computing memory cell according to a seventh embodiment of the present disclosure.

FIG. 9 is a circuit diagram of an computing memory cell C(g)mn according to a seventh embodiment of the present disclosure. When the resistor Rb, resistor Rc and resistor Rd have equal resistance value, the resistor Rb, resistor Rc and resistor Rd may be integrated as a single equivalent resistor, to simplified as the computing memory cell C(g)mn of this embodiment. The resistor Rb of the computing memory cell C(g)mn is the equivalent resistor after integration. The switch elements SW4, SW6 and SW8 are jointly connected to the resistor Rb.

The input values XA and XB of the computing memory cell C(g)mn are "0 0", which correspond to the input signals A1, A1', B1 and B1' being "0 1 0 1". In this case, the switch element SW3, SW7, SW4 and SW6 are turned on, while the switch elements SW1, SW5, SW2 and SW8 are turned off. The sensing current In flows through the resistor Rb through the switch elements SW3 and SW4. Similarly, the input values XA and XB being "0 1" correspond to the input signals A1, A1', B1 and B1' being "0 1 1 0". In this case, the switch elements SW3, SW7, SW2 and SW8 are turned-on, while the switch elements SW1, SW5, SW4 and SW6 are turned off. The sensing current In flows through the resistor Rb through the switch elements SW7 and SW8. The input values XA and XB being "1 0" correspond to the input signals A1, A1', B1 B1' being "1 0 0 1". In this case, the switch elements SW1, SW5, SW4 and SW6 are turned-on, and SW3, SW7, SW2 and SW8 are turned-off, and the sensing current In flows through the resistor Rb through the switch elements SW5 and SW6. From the above, when the input values XA and XB are "0 0", "0 1" and "1 0", the sensing current In flows through the resistor Rb, so that the computing memory cell C(f)mn generates a voltage difference dVmn being In*Rb.

On the other hand, when the input values XA and XB are "1 1", which corresponds to the input signals A1, A1', B1 and B1' being "1 0 1 0", the switch elements SW1, SW5, SW2 and SW8 are turned-on, and SW3, SW7, SW4 and SW6 are turned-off. The sensing current In flows through the resistor Ra through the switch elements SW1 and SW2, so that the computing memory cell C(f)mn generates a voltage difference dVmn being In*Ra.

The resistances Ra and Rb may be adjusted as the second resistance value RH or the first resistance value RL respectively, so that the computing memory cell C(f)mn performs different types of logic operations. In an example, the resistor Ra is adjusted as the second resistance value RH, the resistor Rb is adjusted as the first resistance value RL, the second resistance value RH is greater than the first resistance value RL. The computing memory cell C(e)mn may perform a logical "AND" operation of the input value XA and the input value XB, as shown in Table 8-1.

TABLE 8-1

| Logic AND | | Wmn = 0 | |
|---|---|---|---|
| operation | | dVmn | Yn |
| XA XB = [0 0] | A1A1'B1B1' = [0 1 0 1] | In*Rb = In*RL | 0 |
| XA XB = [0 1] | A1A1'B1B1' = [0 1 1 0] | In*Rb = In*RL | 0 |
| XA XB = [1 0] | A1A1'B1B1' = [1 0 0 1] | In*Rb = In*RL | 0 |
| XA XB = [1 1] | A1A1'B1B1' = [1 0 1 0] | In*Ra = In*RH | 1 |

In another example, the resistor Ra is adjusted as the first resistance value RL, and the resistor Rb is adjusted as the second resistance value RH, then the computing memory cell C(e)mn may perform the logic "NAND" operation of input value XA and the input value XB, as shown in Table 8-2.

TABLE 8-2

| Logic NAND | | Wmn = 0 | |
|---|---|---|---|
| operation | | dVmn | Yn |
| XA XB = [0 0] | A1A1'B1B1' = [0 1 0 1] | In*Rb = In*RH | 1 |
| XA XB = [0 1] | A1A1'B1B1' = [0 1 1 0] | In*Rb = In*RH | 1 |
| XA XB = [1 0] | A1A1'B1B1' = [1 0 0 1] | In*Rb = In*RH | 1 |
| XA XB = [1 1] | A1A1'B1B1' = [1 0 1 0] | In*Ra = In*RL | 0 |

Figure 10:
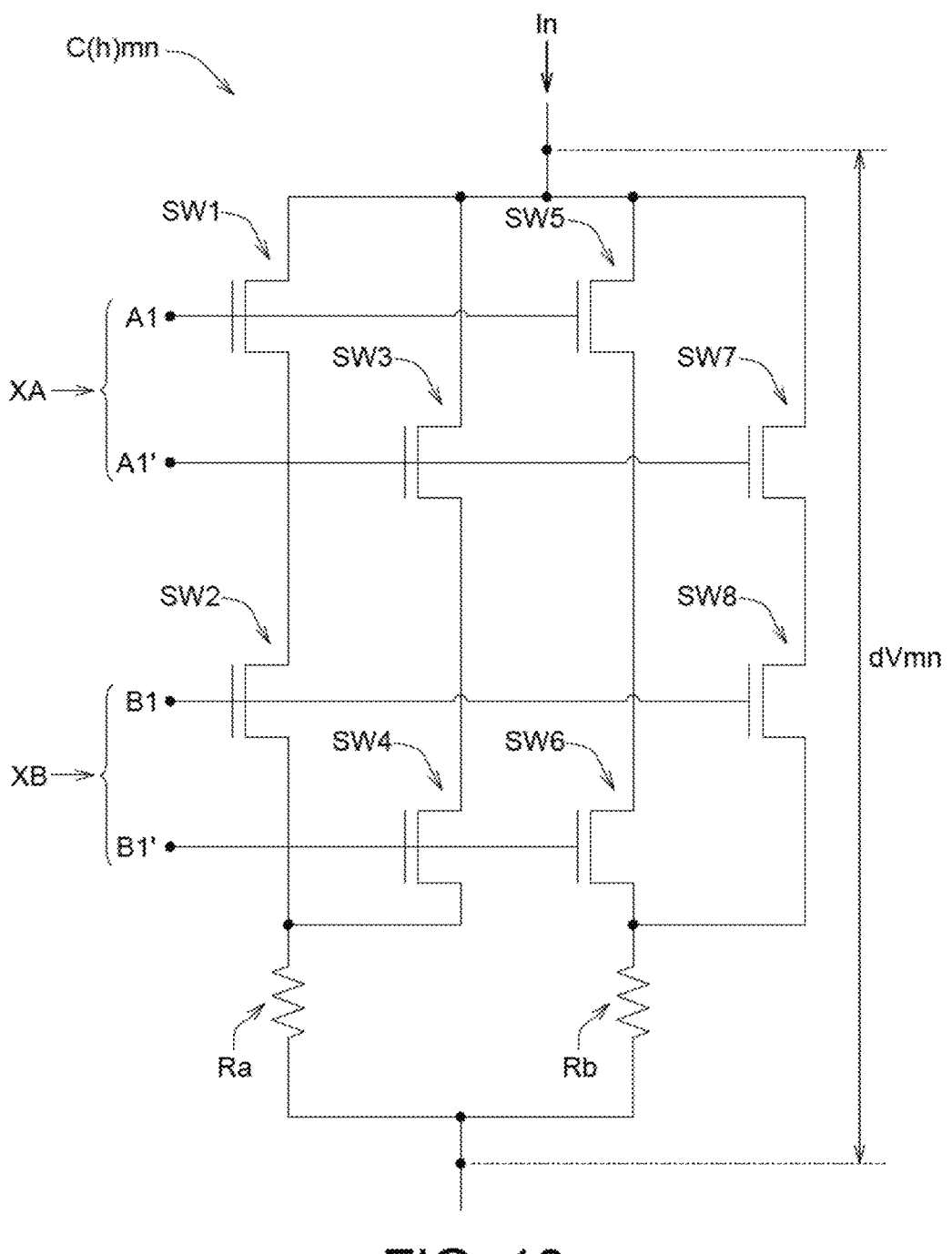
FIG. 10 is a circuit diagram of the computing memory cell according to the eighth embodiment of the present disclosure.

FIG. 10 is a circuit diagram of the computing memory cell C(h)mn according to the eighth embodiment of the present disclosure. When the resistor Ra and resistor Rb of memory cell C(f)mn have equal resistance value, the resistor Ra and resistor Rb may be integrated as a single first equivalent resistor, and when the resistor Rc and resistor Rd of memory cell C(f)mn have equal resistance value, the resistor Rc and resistor Rd may be integrated as a single second equivalent resistor. Accordingly, The resistor Ra of the computing memory cell C(h)mn of FIG. 10 is the first equivalent resistor after integration, and the resistor Rb of the computing memory cell C(h)mn of FIG. 10 is the second equivalent resistor after integration. The switch elements SW2 and SW4 are jointly connected to the resistor Ra, and the switch elements SW6 and SW8 are jointly connected to the resistor Rb.

When the input values XA and XB are "0 0" which correspond to the input signals A1, A1', B1 and B1' being "0 1 0 1", the sensing current In flows through the resistor Ra through the switch elements SW3 and SW4. When the input values XA and XB are "1 1" which correspond to the input signals A1, A1', B1 and B1' being "1 0 1 0", the sensing current In flows through the resistor Ra through the switch elements SW1 and SW2.

On the other hand, when the input values XA and XB are "1 0" which correspond to the input signals A1, A1', B1 and B1' being "1 0 0 1", the sensing current In flows through the resistor Rb through the switch elements SW5 and SW6. When the input values XA and XB are "0 1" which correspond to the input signals A1, A1', B1 and B1' being "0 1 1 0", the sensing current In flows through the resistor Rb through the switch elements SW7 and SW8.

In an example, the resistor Ra is adjusted as the second resistance value RH, the resistor Rb is adjusted as the first resistance value RL, the second resistance value RH is greater than the first resistance value RL, and the computing memory cell C(h)mn may perform the logic "XNOR" between the input value XA and the input value XB, as shown in Table 9-1.

TABLE 9-1

| Logic XNOR | | Wmn = 0 | |
|---|---|---|---|
| operation | | dVmn | Yn |
| XA XB = [0 0] | A1A1'B1B1' = [0 1 0 1] | In*Ra = In*RH | 1 |
| XA XB = [0 1] | A1A1'B1B1' = [0 1 1 0] | In*Rb = In*RL | 0 |
| XA XB = [1 0] | A1A1'B1B1' = [1 0 0 1] | In*Rb = In*RL | 0 |
| XA XB = [1 1] | A1A1'B1B1' = [1 0 1 0] | In*Ra = In*RH | 1 |

In another example, the resistor Ra is adjusted as the first resistance value RL, the resistor Rb is adjusted as the second resistance value RH, and the computing memory cell C(h) mn may perform the logic "XOR" operation between the input value XA and the input value XB, as shown in Table 9-2.

TABLE 9-2

| Logic XOR | | Wmn = 0 | |
|---|---|---|---|
| operation | | dVmn | Yn |
| XA XB = [0 0] | A1A1'B1B1' = [0 1 0 1] | In*Ra = In*RL | 0 |
| XA XB = [0 1] | A1A1'B1B1' = [0 1 1 0] | In*Rb = In*RH | 1 |
| XA XB = [1 0] | A1A1'B1B1' = [1 0 0 1] | In*Rb = In*RH | 1 |
| XA XB = [1 1] | A1A1'B1B1' = [1 0 1 0] | In*Ra = In*RL | 0 |

According to various embodiments of the present disclosure described above, the computing memory cell is composed of one or more transistors and/or resistors. The threshold voltage of the transistor may be adjusted to change the weight value stored in the computing memory cell, and the resistor(s) may be adjusted to have a high resistance value, a low resistance value or resistance values with different ratios, according to the weight value. In addition, according to the input voltage corresponding to the input value, the computing memory cell is controlled to operate in the "transistor state" or the "resistor state", hence the sensing current is controlled to selectively flow through the transistor or the resistor, so that the computing memory cell generates a corresponding voltage difference to represent the output value. The output value represents a result of a product operation of the input value and the weight value, and may be summed-up to obtain a sum of the products. In addition, the computing memory cell may also include a multiplexer. Through the operation of the multiplexer, the sensing current selectively flows through the resistor on the selected path, so that the computing memory cell may perform a logic operation of the input value and the weight value, or perform a logic operation between two bits of the input values. Compared with the traditional computing memory cell with "current summation", the computing memory cell of the present disclosure has a circuit structure of "voltage summation", and the output value is represented by a sum of the voltage differences. The circuit structure of "voltage summation" in the present disclosure may reduce the total current to save power consumption and may reduce circuit complexity.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A memory device, comprising:
a plurality of computing memory cells, each of the computing memory cells stores a weight value, receives an input value and generates an output value, and each of the computing memory cells comprising:
a first switch element, for receiving a sensing current and a first input signal, the first input signal is related to the input value;
a first resistor, connected to the first switch element in series, the first resistor selectively receives the sensing current through the first switch element in response to the first input signal;
a second switch element, for receiving the sensing current and a second input signal, the second input signal is related to the input value; and
a second resistor, connected to the second switch element in series, the second resistor selectively receives the sensing current through the second switch element in response to the second input signal;
wherein, when the sensing current flows through the first resistor, the computing memory cell generates a first voltage difference or a second voltage difference, when the sensing current flows through the second resistor, the computing memory cell generates the first voltage difference or the second voltage difference, the first voltage difference and the second voltage difference correspond to the output value, the output value is equal to a product of the input value and the weight value, or the output value is equal to a result of a logical operation of the input value and the weight value.

2. The memory device according to claim 1, wherein, in response to the weight value, the first resistor is adjusted to have a first resistance value or a second resistance value, and the second resistor is adjusted to have the first resistance value or the second resistance value, the first resistance value is less than the second resistance value.

3. The memory device according to claim 2, wherein:
when the sensing current flows through the first resistor, if the first resistor has the first resistance value, the first voltage difference generated by the computing memory cell is substantially equal to a product of a current value of the sensing current and the first resistance value, if the first resistor has the second resistance value, the second voltage difference generated by the computing memory cell is substantially equal to a product of the current value of the sensing current and the second resistance value.

4. The memory device according to claim 2, wherein:
when the sensing current flows through the second resistor, if the second resistor has the first resistance value, the first voltage difference generated by the computing memory cell is substantially equal to a product of a current value of the sensing current and the first resistance value, if the second resistor has the second resistance value, the second voltage difference generated by the computing memory cell is substantially equal to a product of the current value of the sensing current and the second resistance value.

5. A memory device, comprising:
a plurality of computing memory cells, each of the computing memory cells stores a weight value, receives a first input value and a second input value and generates an output value, and each of the computing memory cells comprising:
a first set of switch elements, being turned-on or turned-off in response to a first input signal and a second input signal;
a first resistor, connected to the first set of switch elements in series, the first resistor selectively receives a sensing current through the first set of switch elements;
a second set of switch elements, being turned-on or turned-off in response to a third input signal and a fourth input signal;
a second resistor, connected to the second set of switch elements in series, the second resistor selectively receives the sensing current through the second set of switch elements;
a third set of switch elements, being turned-on or turned-off in response to the first input signal and the fourth input signal;
a third resistor, connected to the third set of switch elements in series, the third resistor selectively receives the sensing current through the third set of switch elements;
a fourth set of switch elements, being turned-on or turned-off in response to the third input signal and the second input signal; and
a fourth resistor, connected to the fourth set of switch elements in series, the fourth resistor selectively receives the sensing current through the fourth set of switch elements;
wherein, the first input signal and the third input signal are related to the first input value, the second input signal and the fourth input signal are related to the second input value, when the sensing current flows through the first resistor, the second resistor, the third resistor or the fourth resistor, the computing memory cell generates at least a first voltage difference or a second voltage difference, the first voltage difference and the second voltage difference correspond to the output value, the output value is equal to a result of a logical operation of the first input value and the second input value.

6. The memory device according to claim 5, wherein, the first resistor, the second resistor, the third resistor and the fourth resistor are adjusted to have at least a first resistance value or a second resistance value in response to the weight value, the first resistance value is less than the second resistance value, the first resistance value corresponds to the first voltage difference, and the second resistance value corresponds to the second voltage difference.

7. The memory device according to claim 6, wherein, when the second resistor, the third resistor and the fourth resistor have equal resistance value, the second resistor, the third resistor and the fourth resistor are integrated as an equivalent resistor, and the second set of switch elements, the third set of switch elements and the fourth set of switch elements are jointly connected to the equivalent resistor.

8. The memory device according to claim 6, wherein:

when the first resistor and the second resistor have equal resistance value, the first resistor and the second resistor are integrated as a first equivalent resistor, and the first set of switch elements and the second set of switch elements are jointly connected to the first equivalent resistor; and when the third resistor and the fourth resistor have equal resistance value, the third resistor and the fourth resistor are integrated as a second equivalent resistor, and the third set of switch elements and the fourth set of switch elements are jointly connected to the second equivalent resistor.

9. A memory device, comprising:

a plurality of computing memory cells, each of the computing memory cells stores a weight value, receives an input value and generates an output value, and each of the computing memory cells comprising:

a multiplexer, for receiving a sensing current and a plurality of input signals, the input signals are related to the input value; and a plurality of resistors, connected to the multiplexer, the resistors selectively receive the sensing current through the multiplexer in response to the input signals;

wherein, when the sensing current flows through one of the resistors, the computing memory cell generates at least a first voltage difference or a second voltage difference, the first voltage difference and the second voltage difference correspond to the output value, and the output value is equal to a product of the input value and the weight value.

10. The memory device according to claim 9, wherein, the resistors are adjusted to have at least a first resistance value or a second resistance value in response to the weight value, the first resistance value is less than the second resistance value, the first resistance value corresponds to the first voltage difference, and the second resistance value corresponds to the second voltage difference.

* * * * *